(12) United States Patent
Yoon et al.

(10) Patent No.: US 12,062,731 B2
(45) Date of Patent: Aug. 13, 2024

(54) SOLAR CELL PANEL

(71) Applicant: SHANGRAO XINYUAN YUEDONG TECHNOLOGY DEVELOPMENT CO. LTD, Jiangxi Province (CN)

(72) Inventors: Philwon Yoon, Seoul (KR); Jinsung Kim, Seoul (KR); Hyunho Lee, Seoul (KR)

(73) Assignee: SHANGRAO XINYUAN YUEDONG TECHNOLOGY DEVELOPMENT CO. LTD, Jiangxi Province (CN)

( * ) Notice: Subject to any disclaimer, the term of this patent is extended or adjusted under 35 U.S.C. 154(b) by 381 days.

(21) Appl. No.: 17/419,024

(22) PCT Filed: Dec. 4, 2019

(86) PCT No.: PCT/KR2019/016980
§ 371 (c)(1),
(2) Date: Jun. 28, 2021

(87) PCT Pub. No.: WO2020/141736
PCT Pub. Date: Jul. 9, 2020

(65) Prior Publication Data
US 2022/0077339 A1    Mar. 10, 2022

(30) Foreign Application Priority Data

Jan. 3, 2019    (KR) .......................... 10-2019-0000942

(51) Int. Cl.
*H01L 31/05*    (2014.01)
*H01L 31/02*    (2006.01)
(Continued)

(52) U.S. Cl.
CPC ...... *H01L 31/0504* (2013.01); *H01L 31/0201* (2013.01); *H01L 31/02013* (2013.01);
(Continued)

(58) Field of Classification Search
CPC ............. H01L 31/0504; H01L 31/0201; H01L 31/02245
See application file for complete search history.

(56) References Cited

U.S. PATENT DOCUMENTS

| | | | |
|---|---|---|---|
| 4,574,160 A | 3/1986 | Cull | |
| 2004/0200522 A1* | 10/2004 | Fukawa | .......... H01L 31/022425 136/259 |

(Continued)

FOREIGN PATENT DOCUMENTS

| | | |
|---|---|---|
| CN | 2082719227 U | 12/2018 |
| EP | 3655998 A1 | 5/2020 |

(Continued)

OTHER PUBLICATIONS

PCT International Search Report in International Appln. No. PCT/KR2019/016980, dated Mar. 17, 2020, 5 pages.

(Continued)

*Primary Examiner* — Jayne L Mershon
(74) *Attorney, Agent, or Firm* — Tarolli, Sundheim, Covell & Tummino LLP

(57) ABSTRACT

A solar cell according to an embodiment of the present disclosure is positioned so that a second solar cell adjacent to a first solar cell in a first direction have an adjacent portion in contact with or overlapping with the first solar cell in the first direction on a front surface of the first solar cell. In this case, a plurality of wiring members connecting the first and second solar cells are formed to be extended to the front surface of the first solar cell, the adjacent portion, and the rear surface of the second solar cell.

20 Claims, 9 Drawing Sheets

(51) Int. Cl.
H01L 31/0224 (2006.01)
H01L 31/0236 (2006.01)

(52) U.S. Cl.
CPC ........... *H01L 31/022425* (2013.01); *H01L 31/02366* (2013.01)

(56) References Cited

U.S. PATENT DOCUMENTS

| | | |
|---|---|---|
| 2007/0283996 A1 | 12/2007 | Hachtmann et al. |
| 2012/0125391 A1 | 5/2012 | Pinarbasi et al. |
| 2017/0077343 A1 | 3/2017 | Morad et al. |
| 2017/0085217 A1 | 3/2017 | Morad et al. |
| 2018/0019349 A1* | 1/2018 | Erben .................. H01L 31/0201 |
| 2020/0295205 A1* | 9/2020 | Lee ..................... H01L 31/0504 |
| 2020/0373448 A1* | 11/2020 | Kyeong ............... H01L 31/0504 |
| 2021/0135031 A1* | 5/2021 | Yoon ................... H01L 31/0504 |

FOREIGN PATENT DOCUMENTS

| | | |
|---|---|---|
| KR | 1020150084891 | 7/2015 |
| KR | 101823605 | 1/2018 |
| KR | 20180076197 A | 7/2018 |
| KR | 101879374 B1 | 8/2018 |

OTHER PUBLICATIONS

EP Search Report dated Aug. 5, 2022 for corresponding EP application No. 19907669.6.
Korean Office Action for corresponding Korean Application Serial No. 10-2019-0000942, dated Jul. 25, 2023, pp. 1-14.

\* cited by examiner

[FIG. 1]
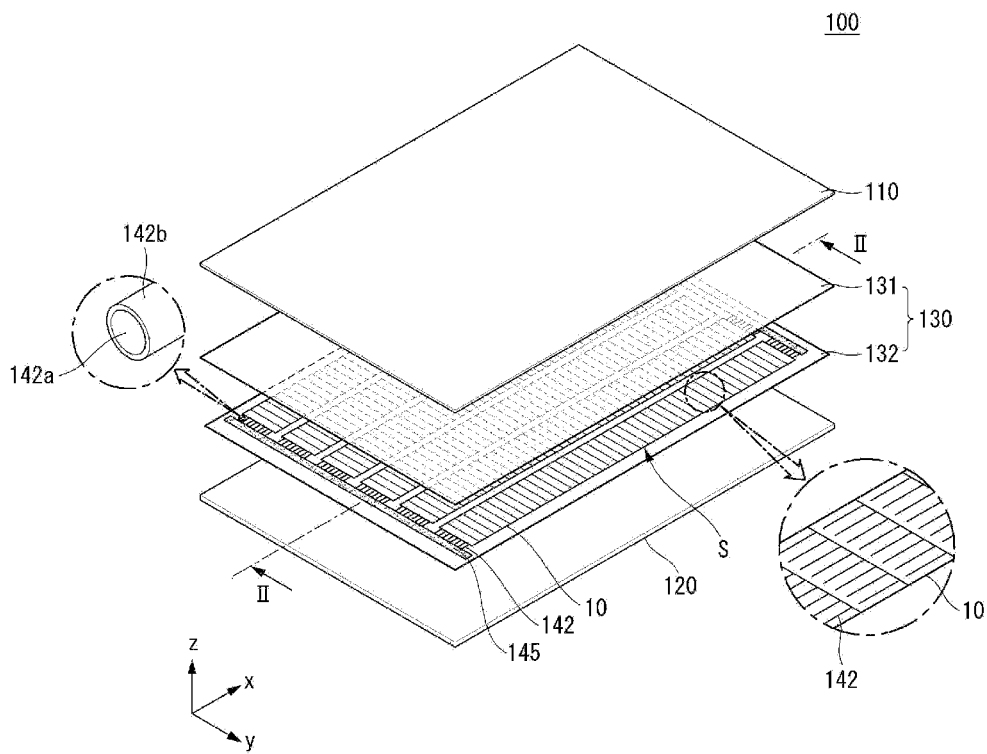
[FIG. 2]
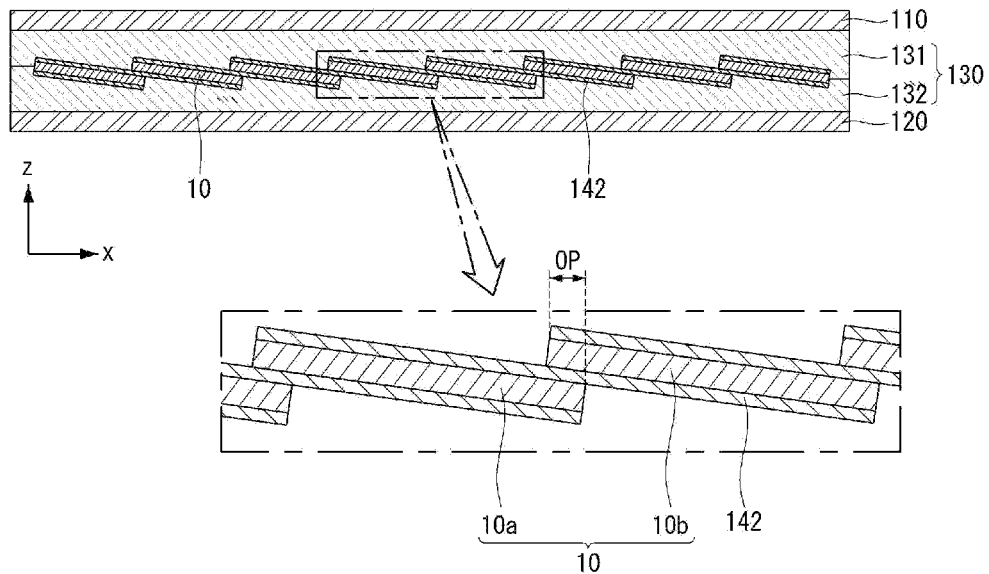

[FIG. 3]
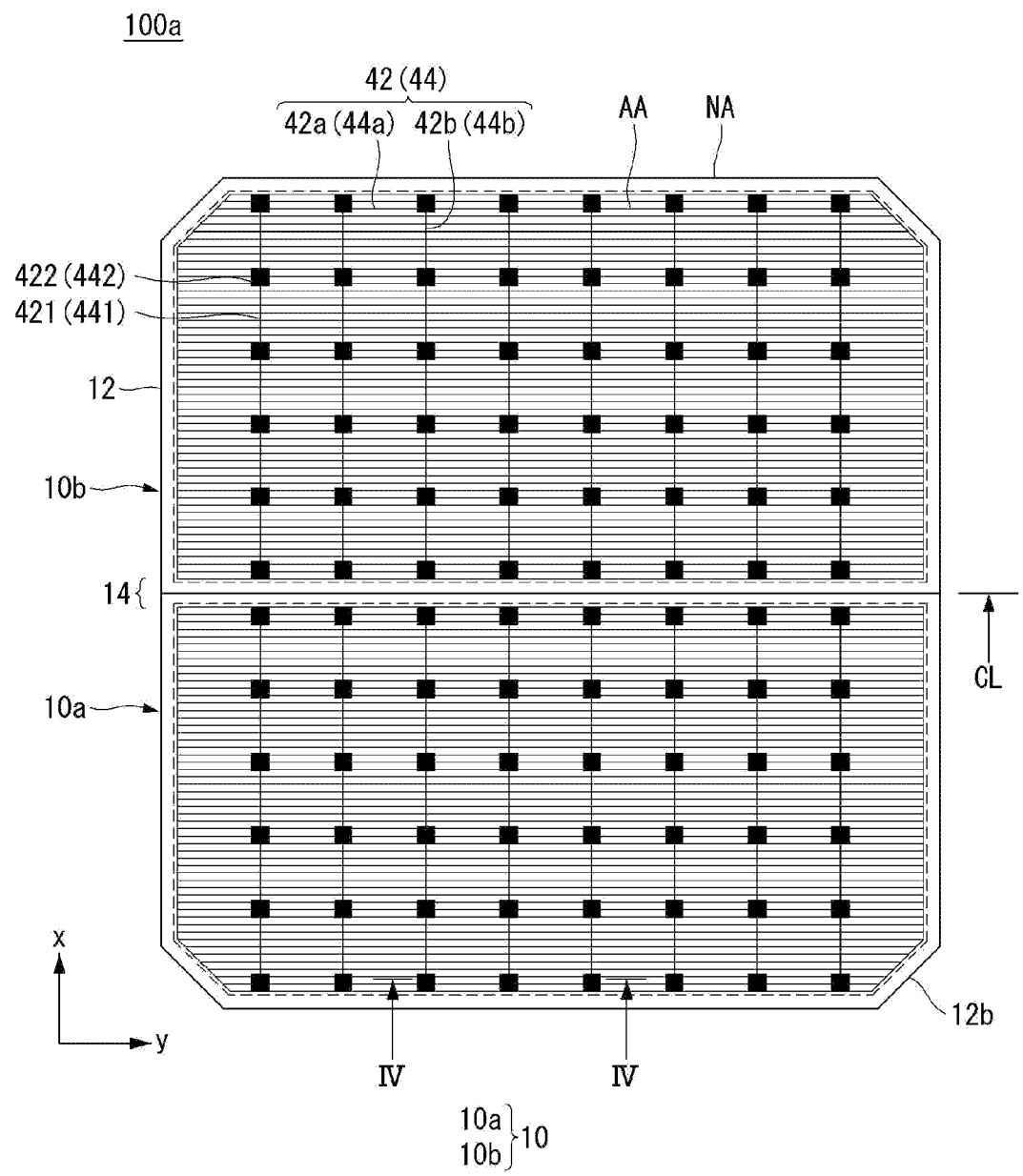

[FIG. 4]
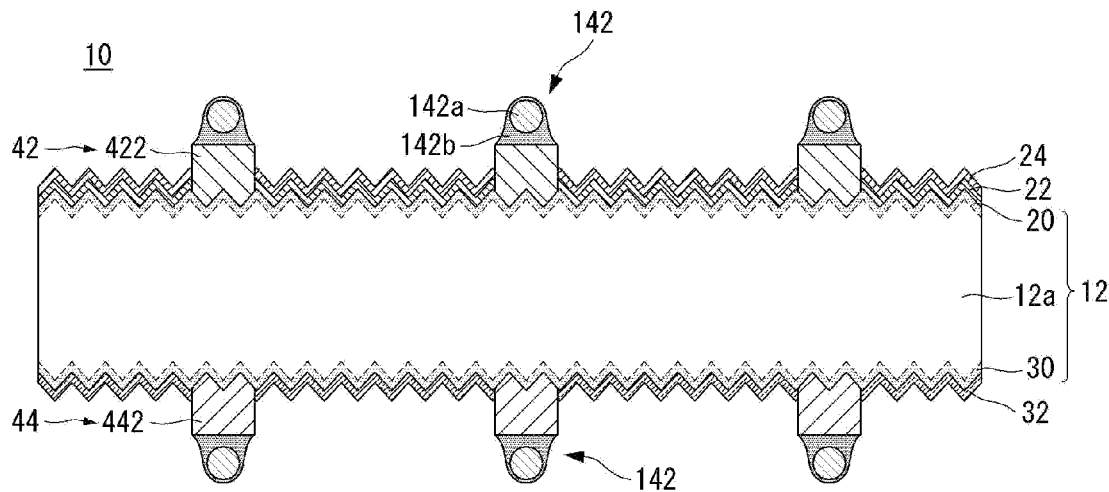
[FIG. 5]
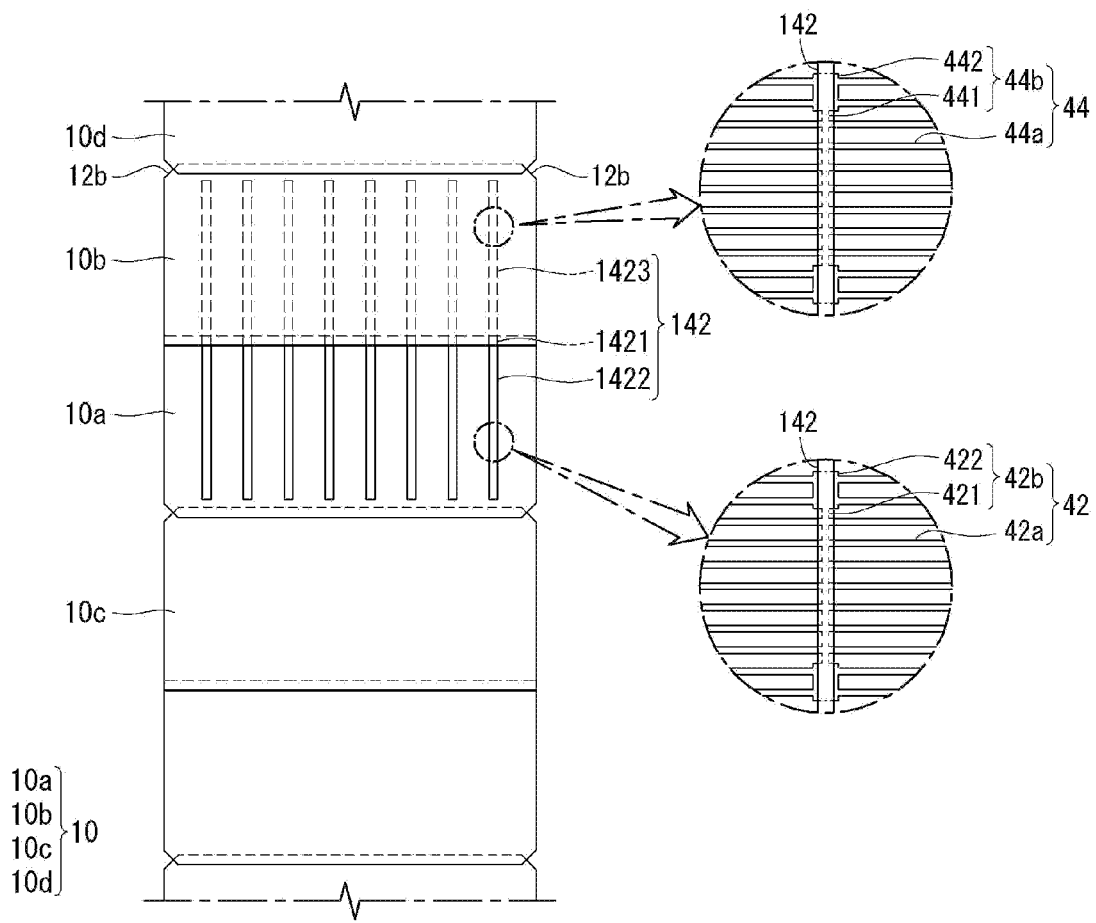

[FIG. 6]
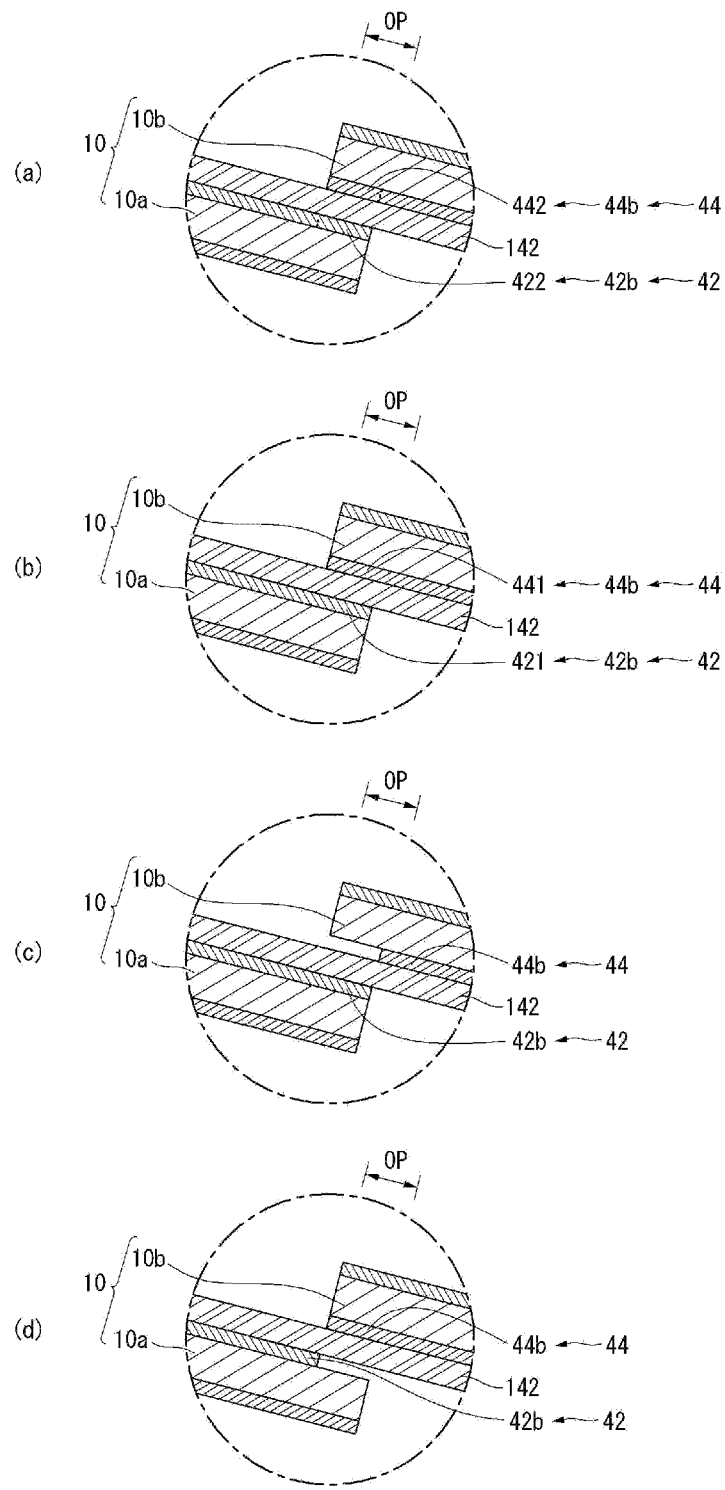

[FIG. 7]
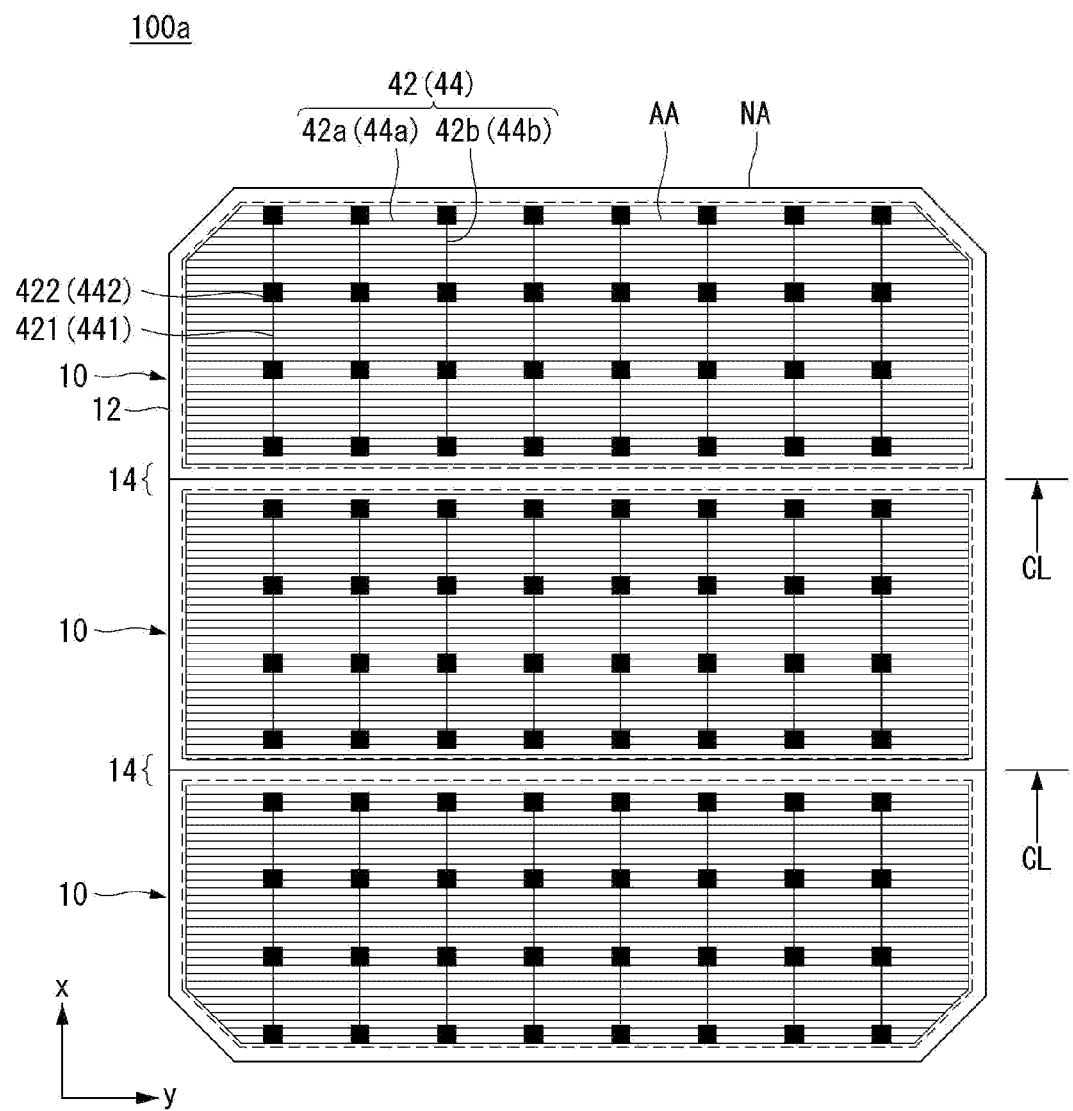

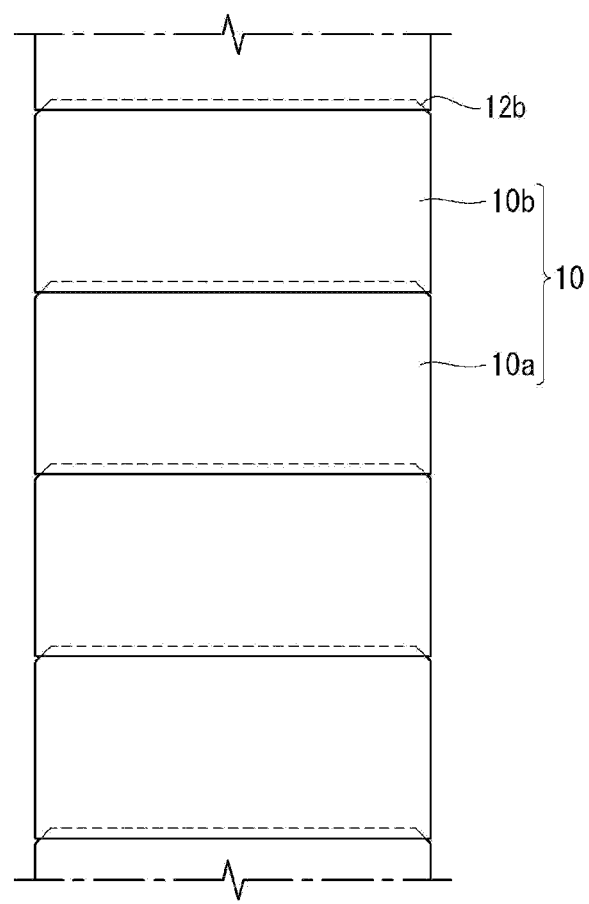
[FIG. 8]

[FIG. 9]
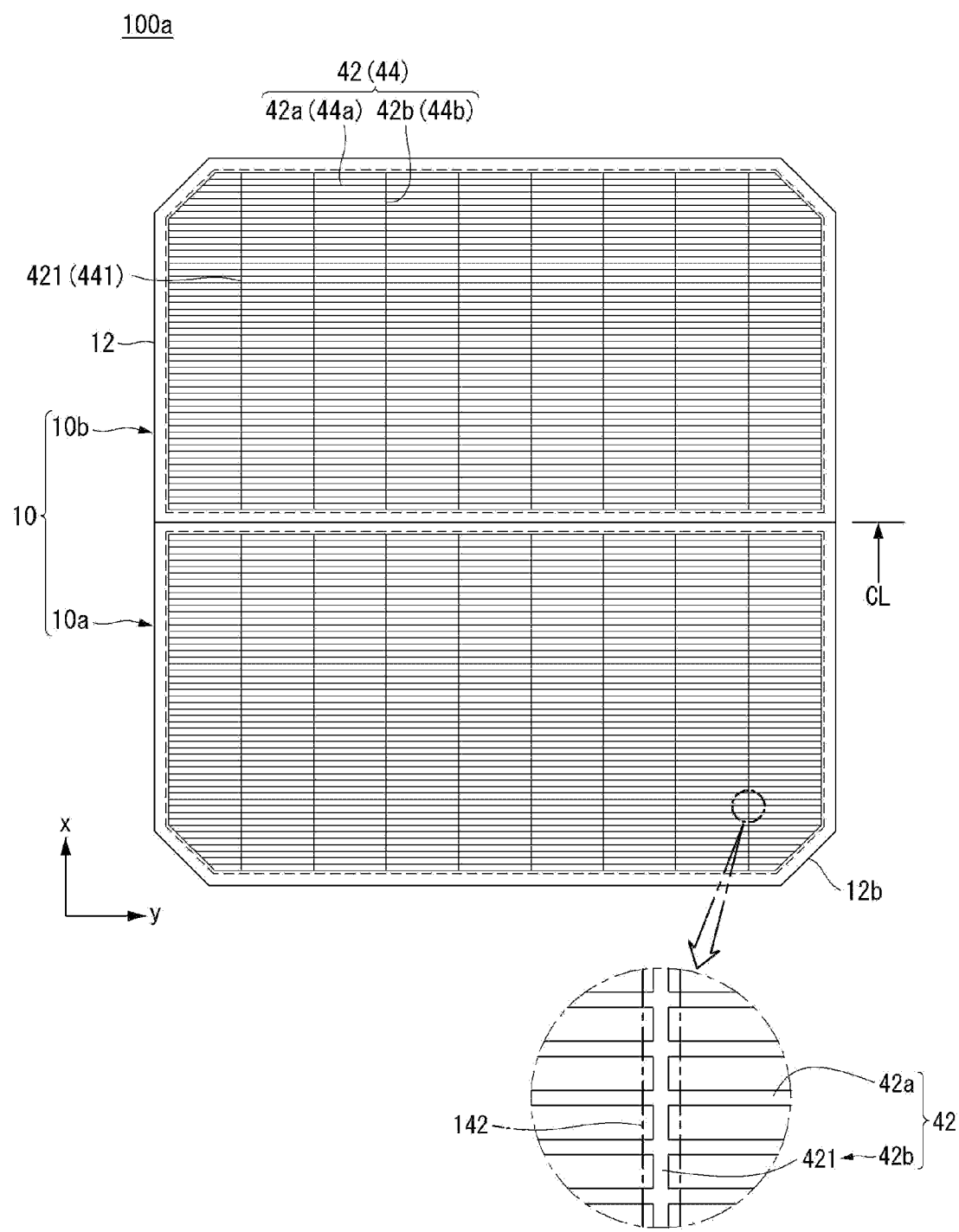

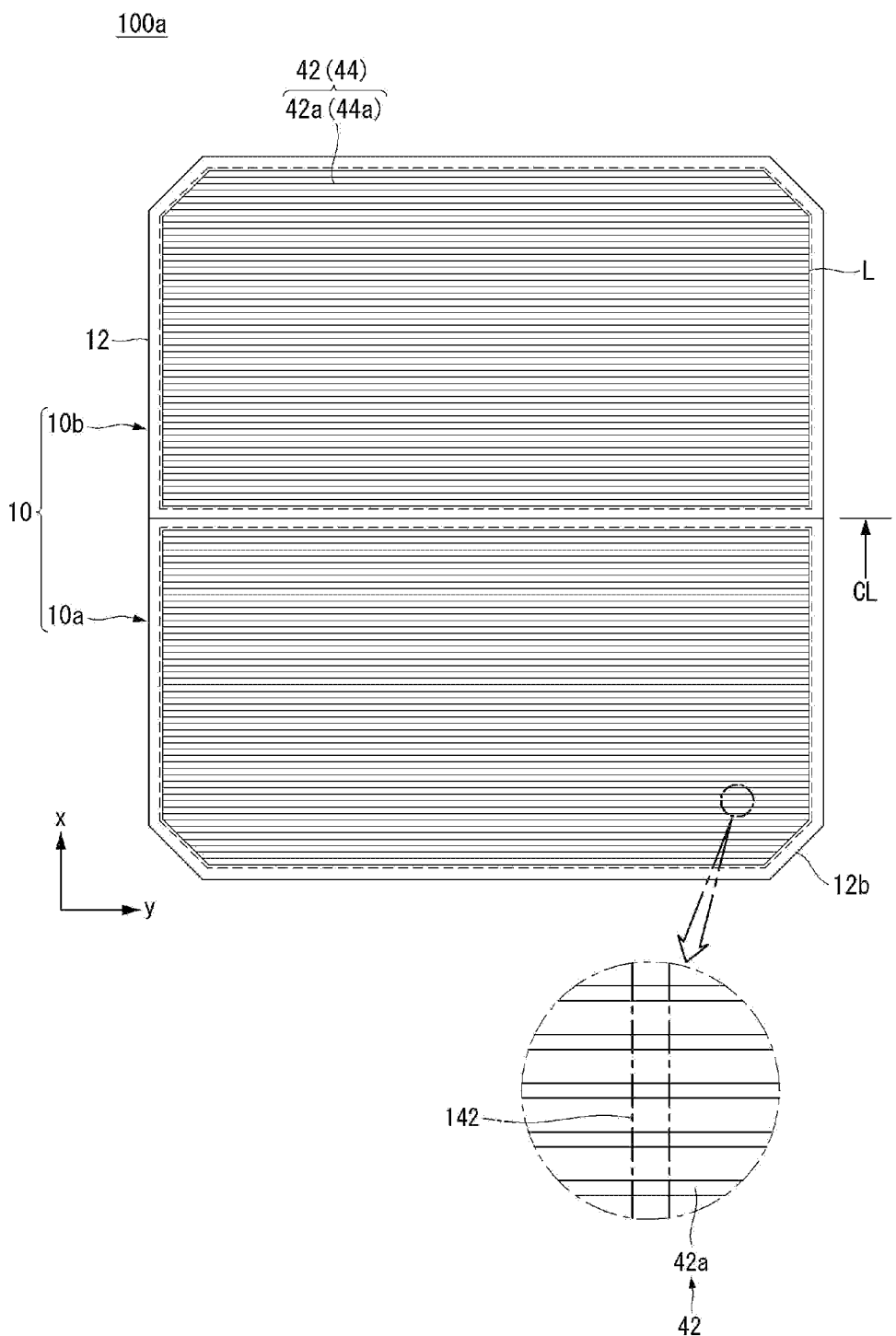
[FIG. 10]

[FIG. 11]
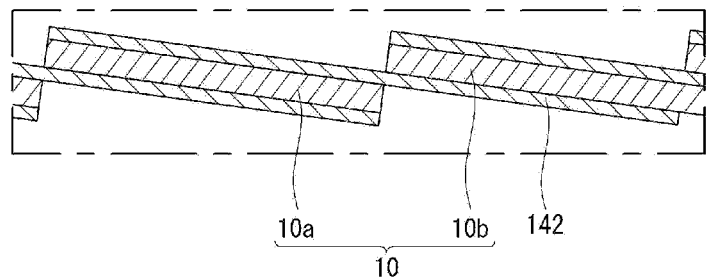
[FIG. 12]
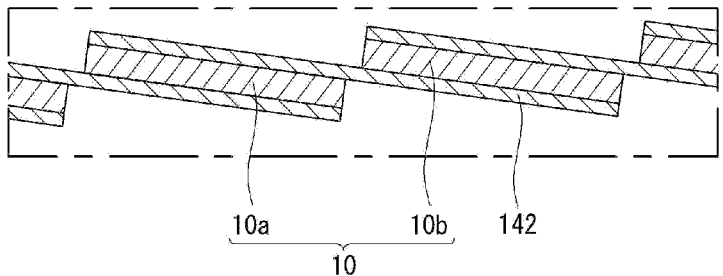
[FIG. 13]
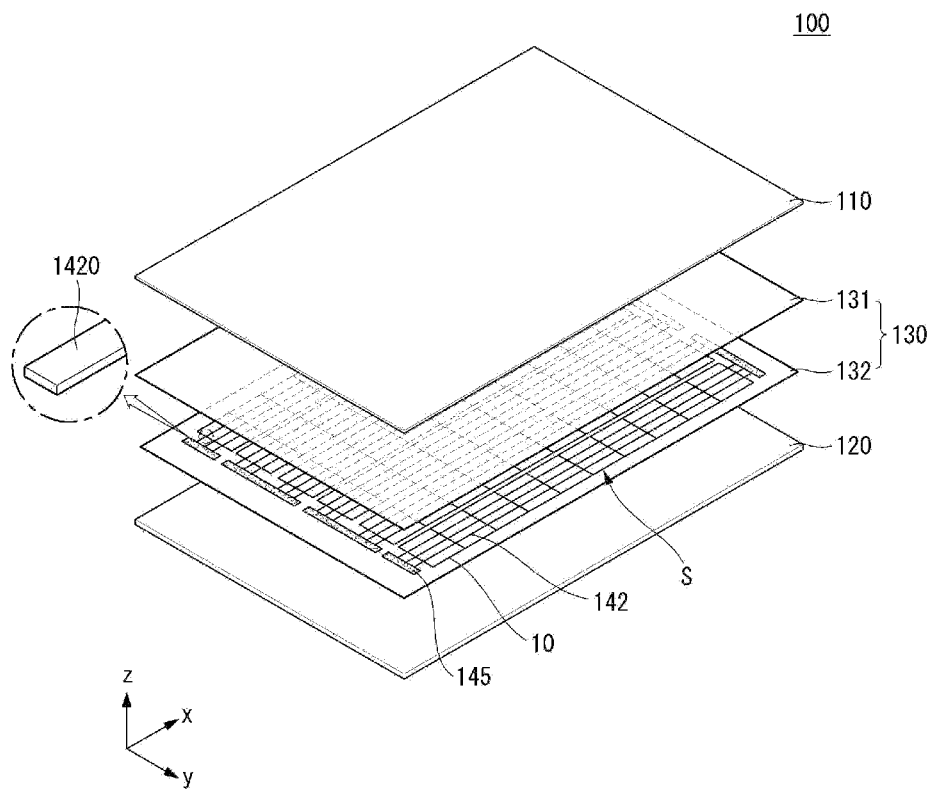

SOLAR CELL PANEL

CROSS-REFERENCE TO RELATED APPLICATIONS

This application is a National Stage application under 35 U.S.C. § 371 of International Application No. PCT/KR2019/016980, filed on Dec. 4, 2019, which claims the benefit of Korean Patent Application No. 10-2019-0000942, filed on Jan. 3, 2019. The disclosures of the prior applications are incorporated by reference in their entirety.

TECHNICAL FIELD

The present disclosure relates to a solar cell panel, and more particularly, to a solar cell panel having an improved connection structure of solar cells.

BACKGROUND

A plurality of solar cells are connected in series or in parallel, and are manufactured in the form of a solar cell panel by a packaging process for protecting the plurality of solar cells.

As a structure connecting the solar cells, various structures may be applied. For example, it is possible to form a long overlapping portion with a narrow width by overlapping a part of the neighboring solar cells, and an electrical conductive adhesive (ECA) is applied to the overlapping portion to electrically and physically connect between neighboring solar cells. According to this structure, since more solar cells may be positioned in the solar cell panel, it may be advantageous for the efficiency of the solar cell panel.

However, the cost of a conductive adhesive layer is expensive, and since the conductive adhesive layer is a material that requires attention when handling, the use of the conductive adhesive layer may reduce the stability of the manufacturing process. In addition, the process is complicated because a process of aligning and attaching a plurality of solar cells and the conductive adhesive layer for connection thereof must be performed. In particular, in the case of a cut solar cell that is cut from a mother solar cell so that each solar cell has a long axis and a short axis, the conductive adhesive layer is formed on the mother solar cell to correspond to each cut solar cell, and the mother solar cell is cut to form a cut solar cell, and then the cut solar cell is attached using the conductive adhesive layer. Accordingly, the process is very complicated, so that defects may easily occur, and the yield may be low. Accordingly, there is a limit to maximizing and implementing the effect of the connection structure of the solar cell using the overlapping portion.

As another conventional technique, as in U.S. Patent Publication No. 2017/0085217, in a solar cell connection structure using an overlapping portion, a technology has been disclosed in which an electrode positioned at the overlapping portion of one solar cell and a pad portion positioned at a rear surface of a solar cell adjacent thereto are connected by an interconnector. In this structure, since the interconnector is positioned only at the overlapping portion and the rear surface, it is difficult to efficiently collect and transfer carriers. And since the interconnector undesirably comes into contact with the portions other than the overlapping portion and the pad portion, problems such as unwanted shunting and damage to the solar cell may occur. In order to prevent this, when the interconnector is bent or folded, damage or failure of the interconnector may occur, and structural stability may be deteriorated.

SUMMARY

Technical Problem

The present disclosure is to provide a solar cell panel capable of improving output, simplifying the manufacturing process, improving the stability of the manufacturing process, and reducing costs.

Here, the present disclosure is to provide a solar cell panel capable of improving output and improving the efficiency per unit area by applying a structure that minimizes a distance between adjacent solar cells, and simplifying the manufacturing process, improving the stability of the manufacturing process, and reducing costs not by using the conductive adhesive layer.

More specifically, the present disclosure is to provide a solar cell panel capable of maintaining the connection structure of solar cells firmly and maximizing the collection efficiency of the carriers by applying the overlapping portion and the wiring member. In particular, the present disclosure is to provide a solar cell panel capable of improving structural and electrical connection stability by using thinner wiring members with a solar cell having a long axis and a short axis.

Technical Solution

A solar cell according to an embodiment of the present disclosure is positioned so that a second solar cell adjacent to a first solar cell in a first direction have an adjacent portion in contact with or overlapping with the first solar cell in the first direction on a front surface of the first solar cell. In this case, a plurality of wiring members connecting the first and second solar cells are formed to be extended to the front surface of the first solar cell, the adjacent portion, and the rear surface of the second solar cell. For example, the plurality of wiring members may include an intervening portion positioned between the front surface of the first solar cell and the rear surface of the second solar cell in the adjacent portion, a first extension portion to be extended from the intervening portion to a light receiving portion other than the adjacent portion from the front surface of the first solar cell, and a second extension portion to be extended from the intervening portion to a portion other than the adjacent portion from the rear surface of the second solar cell. The wiring member may have various shapes or structures such as wires, ribbons, connecting members, and interconnectors.

The first and second solar cells each may include a semiconductor substrate, a first electrode positioned on the front surface of the semiconductor substrate, and a second electrode positioned on the rear surface of the semiconductor substrate, and the wiring member may connect the first electrode of the first solar cell and the second electrode of the second solar cell.

The first electrode may include a plurality of first finger lines formed in a second direction crossing the first direction, and each of the plurality of wiring members may be extended in the first direction.

The second electrode may include at least one of a plurality of second finger lines formed in a second direction crossing the first direction, and a plurality of second bus bars formed in the first direction and spaced apart from each other in the second direction, and the plurality of wiring members may be connected to at least one of the second finger line and the second bus bar of the second solar cell.

The first extension portion may have a width or a diameter of 500 μm or less and may be spaced apart from each other in a second direction crossing the first direction. At least one of the first and second electrodes may include a plurality of finger lines formed in a second direction crossing the first direction, and a width or a diameter of the wiring member may be smaller than a pitch of the plurality of finger lines.

The wiring member may include a core layer and a solder layer formed on the core layer, and may be fixed and attached to the first and second electrodes by soldering using the solder layer.

The first and second solar cells each may have a long axis and a short axis, and the plurality of wiring members may be extended in a short axis direction parallel to the first direction.

The first and second solar cells each may have a long axis and a short axis, the first electrode may include a plurality of first finger lines to be extended in the long axis direction, and each of the plurality of wiring members may be extended in the short axis direction and may be positioned to pass through the plurality of first finger lines of the first solar cell. For example, the second electrode may include a plurality of second finger lines to be extended in the long axis direction, and each of the plurality of wiring members may be extended in the short axis direction and may be positioned to pass through the plurality of second finger lines of the second solar cell.

A portion of the rear surface of the second solar cell may be positioned on the front surface of the first solar cell to form an overlapping portion. Each of the plurality of wiring members may pass between the first solar cell and the second solar cell at the overlapping portion and may be extended to the front surface of the first solar cell and the rear surface of the second solar cell. At least one of the first and second electrodes may include a plurality of finger lines formed in a second direction crossing the first direction, and the plurality of wiring members may be spaced apart from each other in the second direction parallel to the plurality of finger lines in the overlapping portion. The second electrode may include a plurality of second finger lines to be extended in a second direction crossing the first direction, and each of the plurality of wiring members may be extended in the first direction and may be positioned to pass through the plurality of second finger lines of the second solar cell. Accordingly, each of the plurality of wiring members may be extended from one side of the front surface of the first solar cell opposite to the adjacent portion to the other side of the rear surface of the second solar cell opposite to the adjacent portion. Here, each of the plurality of wiring members may not have a portion bent or folded to have an acute angle from the one side of the front surface of the first solar cell to the other side of the rear surface of the second solar cell. And a difference in position of the wiring member (for example, a difference in position of the intervening portion and the first extension portion, of the intervening portion and the second extension portion, and of the first extension portion and the second extension portion) in a thickness direction of the first or second solar cell may be smaller than a thickness of the first or second solar cell.

The first and second solar cells each may have a long axis and a short axis, a portion of the rear surface of the second solar cell may be positioned on the front surface of the first solar cell to form an overlapping portion extended in the long axis direction. In this case, the wiring member may be extended in the short axis direction. A width, a diameter, or a thickness of the wiring member may be smaller than a width of the overlapping portion in the short axis direction. A distance between the first solar cell and the second solar cell positioned in the overlapping portion in the thickness direction may be smaller than the width of the overlapping portion in the short axis direction. For example, the wiring member may have a width or a diameter of 210 μm or less. Here, the wiring member may include a core layer and a solder layer formed on the core layer, and an intervening portion may be fixed and attached to at least one of the first electrode of the first solar cell and the second electrode of the second solar cell within the overlapping portion by soldering using the solder layer.

The first and second solar cells each may have a long axis and a short axis, and a length ratio of the long axis to the short axis may be 1.5 to 4.5 in the first and second solar cells.

Advantageous Effects

According to the present embodiment, it is possible to maximize the number of solar cells included in the solar cell panel and the area in which the solar cells are positioned by applying a structure that minimizes the distance between adjacent solar cells. Accordingly, it is possible to improve the output of solar cell panels and improve the efficiency per unit area. In this case, since a conductive adhesive layer is not used, it is possible to simplify the manufacturing process, improve the stability of the manufacturing process, and reduce the cost. In particular, by applying the overlapping portion and the wiring member, it is possible to firmly maintain the connection structure of the solar cell and maximize the collection efficiency of the carrier. In this case, even when the solar cell has a long axis and a short axis and thus it is provided a wiring member having a small width, a diameter, or a thickness, it is possible to improve the structural and electrical connection stability.

DESCRIPTION OF DRAWINGS

FIG. 1 is a perspective view schematically illustrating a solar cell panel according to an embodiment of the present disclosure.

FIG. 2 is a schematic cross-sectional view taken along a line II-II in FIG. 1.

FIG. 3 is a plan view illustrating two solar cells formed by cutting one mother solar cell according to an embodiment of the present disclosure.

FIG. 4 is a cross-sectional view illustrating a solar cell and a wiring member attached thereto taken along line IV-IV of FIG. 3.

FIG. 5 is a plan view schematically illustrating a plurality of solar cells included in a solar cell panel and connected by a wiring member shown in FIG. 1.

FIG. 6 is partial cross-sectional views illustrating various examples of a connection structure of a wiring member in an overlapping portion of first and second solar cells included in a solar cell panel shown in FIG. 1.

FIG. 7 is a plan view illustrating a plurality of solar cells formed by cutting one mother solar cell according to a modified example of the present disclosure.

FIG. 8 is a plan view schematically illustrating a plurality of solar cells included in a solar cell panel and connected by a wiring member according to another modification of the present disclosure.

FIG. 9 is a plan view illustrating two solar cells formed by cutting one mother solar cell according to another embodiment of the present disclosure.

FIG. 10 is a plan view illustrating two solar cells formed by cutting one mother solar cell according to still another embodiment of the present disclosure.

FIG. 11 is a partial cross-sectional view schematically illustrating a plurality of solar cells and wiring members included in a solar cell panel according to still another embodiment of the present disclosure.

FIG. 12 is a partial cross-sectional view schematically illustrating a plurality of solar cells and wiring members included in a solar cell panel according to still another modification of the present disclosure.

FIG. 13 is a perspective view schematically illustrating a solar cell panel according to still another embodiment of the present disclosure.

DETAILED DESCRIPTION

Hereinafter, embodiments of the present disclosure will be described in detail with reference to the accompanying drawings. However, it is needless to say that the present disclosure is not limited to these embodiments and can be modified into various forms.

In the drawings, illustration of the parts not related to the description is omitted in order to clarify and briefly describe the present disclosure, and the same reference numerals are used for the same or very similar parts throughout the specification. In the drawings, the thickness, width, and the like are enlarged or reduced to make the explanation more clear, and the thickness, width, etc. of the present disclosure are not limited to those shown in the drawings.

When a part is referred to as "including" another part throughout the specification, it does not exclude other parts and may further include other parts unless specifically stated otherwise. Further, when a part of a layer, a film, a region, a plate, or the like is referred to as being "on" other part, this includes not only the case where it is "directly on" the other part but also the case where the other part is positioned in the middle. When the part of the layer, the film, the region, the plate, or the like is referred to as being "directly on" the other part, it means that no other part is positioned in the middle.

Hereinafter, a solar cell panel according to an embodiment of the present disclosure will be described in detail with reference to the accompanying drawings.

FIG. 1 is a perspective view schematically illustrating a solar cell panel according to an embodiment of the present disclosure, and FIG. 2 is a schematic cross-sectional view taken along a line II-II in FIG. 1. For the sake of simplicity, a wiring member 142 connecting a plurality of solar cells 10 is illustrated in the enlarged view of FIG. 1, and the number of the solar cells 10 in FIGS. 1 and 2 is illustrated to be different from each other.

Referring to FIGS. 1 and 2, a solar cell panel 100 according to the present embodiment includes first and second solar cells 10a and 10b connected to each other in a first direction (the x-axis direction in the drawing), and a plurality of wiring members 142 electrically connecting them. More specifically, the first and second solar cells 10a and 10b each include a semiconductor substrate (reference numeral 12 in FIG. 4, hereinafter the same), a first electrode (reference numeral 42 in FIG. 4, hereinafter the same) positioned on a front surface of the semiconductor substrate 12, and a second electrode (reference numeral 44 in FIG. 4, hereinafter the same) positioned on a rear surface of the semiconductor substrate 12. The plurality of wiring members 142 connect the first electrode 42 of the first solar cell 10a and the second electrode 44 of the second solar cell 10b.

In addition, the solar cell module 100 may further include a sealing member 130 that surrounds and seals the plurality of solar cells 10, a first cover member (front member) 110 positioned on a front surface of the solar cell 10 on the sealing member 130, and a second cover member (rear member) 120 positioned on a rear surface of the solar cell 10 on the sealing member 130. This will be described in more detail.

First, the solar cell 10 may include a photoelectric conversion unit that converts the solar cells into electrical energy, and electrodes 42 and 44 that are electrically connected to the photoelectric conversion unit to collect and transmit current. The solar cell 10 will be described in more detail later. The plurality of solar cells 10 may be electrically connected in series, parallel, or series-parallel by the wiring member 142. Specifically, the wiring member 142 may connect the first and second solar cells 10a and 10b adjacent to each other among the plurality of solar cells 10 in series.

In addition, a bus ribbon 145 may be connected by the wiring member 142 to be connected to both ends of the wiring member 142 of the solar cell 10 (that is, a solar cell string S) to form one string. The bus ribbon 145 may be disposed in a direction (i.e. in a second direction (the y-axis direction in the drawing)) crossing the end of the solar cell string S. The bus ribbon 145 may connect adjacent solar cell strings S in series, parallel, or in series-parallel, or connect the solar cell string S to a junction box (not shown) that prevents reverse current flow. The material, shape, and connection structure of the bus ribbon 145 may be variously modified, and the present disclosure is not limited thereto.

The sealing member 130 may include a first sealing member 131 positioned on the front surface of the solar cell 10 connected by the wiring member 142, and a second sealing member 132 positioned on the rear surface of the solar cell 10. The first sealing member 131 and the second sealing member 132 prevent the inflow of moisture and oxygen and chemically couple elements of the solar cell panel 100. The first and second sealing members 131 and 132 may be formed of an insulating material having light-transmitting properties and adhesive properties. For example, ethylene vinyl acetate copolymer resin (EVA), polyvinyl butyral, silicon resin, ester resin, olefin resin, etc. may be used as the first sealing member 131 and the second sealing member 132. The second cover member 120, the second sealing member 132, the solar cell 10, the first sealing member 131, and the first cover member 110 may be integrated to constitute the solar cell panel 100 by lamination process, etc. using the first and second sealing members 131 and 132.

The first cover member 110 is positioned on the first sealing member 131 to constitute a front surface of the solar cell panel 100, and the second cover member 120 is positioned on the second sealing member 132 to constitute a rear surface of the solar cell panel 100. Each of the first cover member 110 and the second cover member 120 may be formed of an insulating material capable of protecting the solar cell 10 from external shock, moisture, and ultraviolet rays, etc. In addition, the first cover member 110 may be formed of a light-transmitting material through which light can be transmitted, and the second cover member 120 may be formed of a sheet made of a light-transmitting material, a non-transmitting material, or a reflective material. For example, the first cover member 110 may be formed of a glass substrate or the like, and the second cover member 120 may have a TPT (Tedlar/PET/Tedlar) type, or may include a polyvinylidene fluoride (PVDF) resin layer formed on at least one surface of a base film (for example, polyethylene terephthalate (PET)).

However, the present disclosure is not limited thereto. Accordingly, the first and second sealing members 131 and 132, the first cover member 110, or the second cover member 120 may include various materials other than those described above and may have various shapes. For example, the first cover member 110 or the second cover member 120 may have various forms (for example, a substrate, a film, a sheet, etc.) or materials.

The solar cell 10 and the wiring member 142 connected thereto according to an embodiment of the present disclosure will be described in more detail with reference to FIGS. 3 and 4 along with FIG. 2. FIG. 3 is a plan view illustrating two solar cells 10 (for example, the first and second solar cells 10a and 10b) formed by cutting one mother solar cell according to an embodiment of the present disclosure, and FIG. 4 is a cross-sectional view illustrating the solar cell 10 and the wiring member 142 attached thereto taken along line IV-IV of FIG. 3. For the sake of simplicity and clear understanding, FIG. 3 mainly illustrates the semiconductor substrate 12 and the first and second electrodes 42 and 44.

Referring to FIGS. 1 to 4, a mother solar cell 100a according to the present embodiment includes a plurality of solar cells 10 to be cut by a cutting line CL. When the mother solar cell 100a is cut along the cutting line CL, the plurality of solar cells 10 are manufactured, and each of the solar cells 10 manufactured in this way functions as one solar cell.

In the drawings and the following description, for convenience, the cutting line CL is positioned to be extended along a center of the mother solar cell 100a, and it is illustrated that two solar cells 10 are manufactured from one mother solar cell 100a. Accordingly, an active area AA in which the conductive regions 20 and 30 and the first and second electrodes 42 and 44 are positioned to correspond to each solar cell 10 are positioned in the parent solar cell 100a. This active areas AA are spaced apart from each other with a separation region 14 interposed therebetween. A non-active area NA in which the conductivity type regions 20 and 30 and/or the first and second electrodes 42 and 44 are not disposed is positioned as a whole at an edge of each solar cell 10, and the separation region 14 is positioned at an edge adjacent to a cutting surface CL among the non-active area NA. The conductivity type regions 20 and 30 and/or the first and second electrodes 42 and 44 are not formed from the time the mother solar cell 100a is manufactured in the separation region 14, or the conductivity type regions 20 and 30 and/or the first and second electrodes 42 and 44 disappear near the cutting line CL in the cutting step, or the separation region 14 is formed while other layer is formed near the cutting line CL. However, the present disclosure is not limited thereto, and various modifications are possible, such as not having a separate separation region 14 or the like. In addition, since there are two or more separation regions 14 or cutting lines CL in one mother solar cell 100a, three or more solar cells 10 may be manufactured from one mother solar cell 100a. This will be described in more detail later with reference to FIG. 7.

In the present embodiment, the solar cell 10 includes the semiconductor substrate 12 including a base region 12a, the conductivity type regions 20 and 30 formed in or on the semiconductor substrate 12, and the electrodes 42 and 44 connected to the conductivity type regions 20 and 30. Here, the conductivity type regions 20 and 30 may include a first conductivity type region 20 and a second conductivity type region 30 having different conductivity types, and the electrodes 42 and 44 may include the first electrode 42 connected to the first conductivity type region 20 and the second electrode 44 connected to the second conductivity type region 30. In addition, an insulating layer such as a first passivation layer 22, an antireflection layer 24, and a second passivation layer 32 may be further included.

The semiconductor substrate 12 may be composed of a crystalline semiconductor (e.g. single crystal or polycrystalline semiconductor, e.g. single crystal or polycrystalline silicon) including a single semiconductor material (e.g. a group 4 element). Then, since it is based on the semiconductor substrate 12 having high crystallinity and low defects, the solar cell 10 may have excellent electrical characteristics.

The front surface and/or the rear surface of the semiconductor substrate 12 may be textured to have irregularities. The irregularities have, for example, a pyramid shape having an irregular size and the outer surface of the semiconductor substrate 12 is formed of (111) surface of the semiconductor substrate 12. Accordingly, when it has a relatively large surface roughness, the reflectance of light may be lowered. However, the present disclosure is not limited thereto.

In the present embodiment, the semiconductor substrate 12 includes the base region 12a having a first or second conductivity type by doping with a first or second conductivity type dopant at a low doping concentration than the first or second conductivity type regions 20 and 30. For example, in the present embodiment, the base region 12a may have the second conductivity type.

For example, the first conductivity type region 20 may constitute an emitter region forming a pn junction with the base region 12a. The second conductivity type region 30 may be a back surface field region that prevents recombination by forming the back surface field. Here, the first and second conductivity type regions 20 and 30 may be entirely formed on the front and rear surfaces of the semiconductor substrate 12, respectively. Accordingly, the first and second conductivity type regions 20 and 30 may be formed with a sufficient area without additional patterning. However, the present disclosure is not limited thereto. For example, the first or second conductivity type regions 20 and 30 may have various structures such as a homogeneous structure, a selective structure, and a local structure.

In the present embodiment, it is illustrated that the base region 12a and the conductivity type regions 20 and 30 forming the semiconductor substrate 12 have a crystal structure of the semiconductor substrate 12 and are regions having different conductivity types and doping concentrations. That is, it is illustrated that the conductivity type regions 20 and 30 are doped regions constituting a part of the semiconductor substrate 12. However, the present disclosure is not limited thereto. Accordingly, at least one of the first conductivity type region 20 and the second conductivity type region 30 may be formed of an amorphous, microcrystalline, or polycrystalline semiconductor layer formed as a separate layer on the semiconductor substrate 12. Other variations are possible.

The first conductivity type dopant included in the first conductivity type region 20 may be an n-type or p-type dopant, and the second conductivity type dopant included in the base region 12a and the second conductivity type region 30 may be a p-type or n-type dopant. As the p-type dopant, group 3 element such as boron (B), aluminum (Al), gallium (Ga), and indium (In) may be used, and as the n-type dopant, group 5 element such as phosphorus (P), arsenic (As), bismuth (Bi), and antimony (Sb) may be used. The second conductivity type dopant of the base region 12a and the second conductivity type dopant of the second conductivity type region 30 may be the same material or different materials.

For example, the first conductivity type region 20 may have a p-type, and the base region 12a and the second conductivity type region 30 may have an n-type. Then, holes having a slower moving speed than electrons move to the front surface of the semiconductor substrate 12 rather than the rear surface, thereby improving conversion efficiency. However, the present disclosure is not limited thereto, and the opposite case is also possible.

An insulating layer such as first and second passivation layers 22 and 32 for passivating defects in the conductivity type regions 20 and 30, and an anti-reflection layer 24 for preventing reflection of light may be formed on the surface of the semiconductor substrate 12. This insulating layer may be formed of an undoped insulating layer that does not separately include a dopant. The first and second passivation layers 22 and 32 and the antireflection layer 24 are substantially entirely on the front or rear surface of the semiconductor substrate 12 except for portions (more precisely, portions where a first or second opening is formed) corresponding to the first or second electrodes 42 and 44.

For example, the first or second passivation layers 22 and 32 or the antireflection layer 24 may have a single layer selected from a group consisting of a silicon nitride, a silicon nitride including hydrogen, a silicon oxide, a silicon oxynitride, an aluminum oxide, $MgF_2$, $ZnS$, $TiO_2$, and $CeO_2$, or a multilayer structure in which two or more layers are combined. For example, the first or second passivation layers 22 and 32 may be formed of the silicon oxide film, and the antireflection layer 24 may include a silicon nitride. In addition, the material of the insulating layer and the laminated structure may be variously modified.

The first electrode 42 is electrically connected to the first conductivity type region 20 through a first opening, and the second electrode 44 is electrically connected to the second conductivity type region 30 through a second opening. The first and second electrodes 42 and 44 may be made of various materials (e.g. metallic materials) and may be formed to have various shapes.

In the present embodiment, the first electrode 42 includes a plurality of first finger lines 42a being extended in one direction, that is, in a second direction (the y-axis direction in the drawing), and positioned parallel to each other, and a first bus bar 42b formed in a direction, that is, in a first direction (the x-axis direction in the drawing) intersecting (e.g. orthogonal) with the first finger line 42a and electrically connected to the first finger line 42a. The wiring member 142 is connected or attached to the first bus bar 42b. In this case, the first finger line 42a may be formed along the long axis of each solar cell 10, and the first bus bar 42b may be formed along the short axis of each solar cell 10.

This first bus bar electrode 42b may be provided with only one, or as shown in FIG. 3, a plurality of first bus bar electrodes 42b may be provided while having a pitch greater than that of the first finger line 42a. In this case, a width of at least a portion of the first bus bar electrode 42b may be larger than a width of the first finger line 42a, but the present disclosure is not limited thereto. Accordingly, the first bus bar electrode 42b may have a width equal to or smaller than that of the first finger line 42a.

In this case, there may be 6 to 33 (e.g. 8 to 33, for example, 10 to 33, in particular, 10 to 15) first bus bars 42b based on one surface of the solar cell 10, and the first bus bars 42b may be positioned at a uniform interval from each other. In each solar cell 10, the first bus bar 42b may have a symmetrical shape when viewed from the extending direction of the first finger line 42a. Accordingly, the moving distance of carriers may be minimized while providing a sufficient number of wiring members 142 connected to the first bus bar 42b.

The first bus bar 42b may include a plurality of first pad portions 422 positioned in the second direction, and further include a first line portion 421 that has a relatively narrow width than the wiring member 142, the first line portion 421 is extended along a direction in which the wiring member is extended. The adhesion to the wiring member 142 may be improved and contact resistance may be reduced by the first pad portion 422, and light loss may be minimized by the first line portion 421. In addition, the first line portion 421 may provide a path through which the carrier may bypass when some of the first finger lines 42a are disconnected.

The second electrode 44 may include a second finger line 44a and a second bus bar 44b corresponding to the first finger line 42a and the first bus bar 42b of the first electrode 42, respectively. The second bus bar 44b may include a plurality of second pad portions 442 corresponding to the plurality of first pad portions 422, and a second line portion 441 corresponding to the first line portion 421. For the second finger line 44a and the second bus bar 44b of the second electrode 44, the content of the first finger line 42a and the first bus bar electrode 42b of the first electrode 42 may be applied as it is. In addition, the content related to the first passivation layer 22 and the antireflection layer 24 that are the first insulating layer in the first electrode 42 may be applied to the second passivation layer 32 that is the second insulating layer in the second electrode 44 as it is. In this case, the width, pitch, and thickness of the first finger line 42a, the first pad portion 422, and the first line portion 421 of the first electrode 42 may be the same as or different from the width, pitch, and thickness of the second finger line 44a, the second pad portion 442, and the second line portion 441 of the second electrode 44. The first bus bar 42b and the second bus bar 44b may be formed at the same position and in the same number. However, the present disclosure is not limited thereto, and the first electrode 42 and the second electrode 44 may have different planar shapes, and other various modifications are possible.

As described above, in the present embodiment, the first and second electrodes 42 and 44 of the solar cell 10 have a constant pattern, so that the solar cell 10 has a bi-facial structure in which light can be incident on the front and rear surfaces of the semiconductor substrate 12. Accordingly, the amount of light used in the solar cell 10 may be increased, thereby contributing to the improvement of the efficiency of the solar cell 10.

However, the present disclosure is not limited thereto, and it is also possible to have a structure in which the second electrode 44 is formed entirely on the rear surface of the semiconductor substrate 12. In addition, the first and second conductivity type regions 20 and 30 and the first and second electrodes 42 and 44 may be positioned together on one surface (for example, the rear surface) of the semiconductor substrate 12, and at least one of the first and second conductivity type regions 20 and 30 may be formed over both surfaces of the semiconductor substrate 12. That is, the above-described solar cell 10 is only presented as an example, and the present disclosure is not limited thereto.

Here, as described above, the solar cell 10 is manufactured by cutting the mother solar cell 100a along the cutting line CL. When the mother solar cell 100a is separated into the plurality of solar cells 10 as described above, it is possible to reduce a cell to module loss (CTM loss) that occurs when the plurality of solar cells 10 are connected to form the solar cell panel 100. That is, if the area of the solar cell 10 is reduced to reduce the current generated by the solar cell 10 itself, even if the number of solar cells 10 reflected as it is increased, it is possible to reduce the output loss of the solar cell panel 100 by reducing the current reflected as a square value According to this embodiment, since the solar cell 10 is manufactured by cutting the mother solar cell 100a manufactured by the conventional manufacturing method, the area of the solar cell 10 is reduced. Therefore, according to the present embodiment, the solar cell 10 can be manufactured by using the existing equipment and the optimized design. Accordingly, the burden of equipment and process costs is minimized. On the other hand, when manufacturing by reducing the size of the mother solar cell 100a itself, there is a burden of replacing equipment or changing setting.

In general, Since the parent solar cell 100a is manufactured from an ingot having a circular shape, the lengths of sides along two axes (for example, an axis parallel to the first finger line 42a and an axis parallel to the first bus bar 42b) orthogonal to each other are the same or substantially similar to each other. For example, in the present embodiment, the semiconductor substrate 12 of the mother solar cell 100a may have an octagonal shape having an inclined side 12b at four corners in a roughly square shape. With such a shape, it is possible to obtain the semiconductor substrate 12 having the largest area from the same ingot. Accordingly, the mother solar cell 100a has a symmetrical shape, and the maximum horizontal axis and the maximum vertical axis, and the minimum horizontal axis and the minimum vertical axis have the same distance.

In the present embodiment, since the mother solar cell 100a is cut along the cutting line CL to form the solar cell 10, the semiconductor substrate 12 of the solar cell 10 has a shape having a long axis and a short axis.

The shapes of the first and second electrodes 42 and 44 described above, and the structure of the solar cell 10 may be variously modified. For example, the solar cell 10 may have various structures using a semiconductor substrate or a semiconductor material, such as a back electrode type solar cell, an amorphous solar cell, and a tandem type solar cell. Alternatively, it may have a structure such as a dye-sensitized solar cell, a compound semiconductor solar cell, or the like. In addition, the position, direction, and shape of the cutting line CL may be variously modified.

The solar cell 10 described above is electrically connected to the adjacent solar cell 10 by the wiring member 142 positioned on (for example, in contact with) the first electrode 42 or the second electrode 44, however, this will be described in more detail with reference to FIGS. 5 and 6 together with FIGS. 1 to 4.

FIG. 5 is a plan view schematically illustrating a plurality of solar cells 10 included in the solar cell panel 100 and connected by the wiring member 142 shown in FIG. 1. And FIG. 6 is partial cross-sectional views illustrating various examples of the connection structure of the wiring member 142 in an overlapping portion OP of the first and second solar cells 10a and 10b included in the solar cell panel 100 shown in FIG. 1. For the sake of simplicity, the wiring member 142 in FIG. 5 schematically illustrates only the wiring member 142 connecting the first and second solar cells 10a and 10b.

As shown in FIGS. 1 to 6, the wiring member 142 connects the first electrode 42 positioned on the front surface of the first solar cell 10a and the second electrode 44 positioned on the rear surface of the second solar cell 10b adjacent to one side thereof (the upper side of FIG. 5). In addition, another wiring member 142 connects the first electrode 42 positioned in a front surface of the third solar cell 10c positioned on the other side of the first solar cell 10a (lower side in FIG. 5) and the second electrode 44 positioned on the rear surface of the first solar cell 10a. In addition, still another wiring member 142 connects the first electrode 42 positioned on the front surface of the second solar cell 10b and the second electrode 44 positioned on the rear surface of another solar cell 10d positioned on one side (upper side of FIG. 5) of the second solar cell 10b. Accordingly, the plurality of solar cells 10 may be connected to each other to form one row by the wiring member 142. Hereinafter, the description of the wiring member 142 may be applied respectively to all wiring members 142 connecting two adjacent solar cells 10 to each other.

In the present embodiment, the second solar cell 10b is positioned to have an adjacent portion that is in contact with or overlaps with the first solar cell 10a in all directions on the front surface of the first solar cell 10a. For example, in FIG. 4, a part of the rear surface of the second solar cell 10b is positioned on the front surface of the first solar cell 10a to form an overlapping portion OP, and the overlapping portion OP constitutes an adjacent portion. In contrast, anther embodiments in which the first and second solar cells 10a and 10b are in contact with each other in the first direction so that the portions in contact with each other constitute an adjacent portion will be described later with reference to FIG. 11.

In this case, on one surface of each solar cell 10, each wiring member 142 is positioned to be extended along the first direction (the x-axis direction in the drawing, the direction crossing the first and second finger lines 42a and 44a, or the extension direction of the first and second bus bars 42b and 44b) to improve electrical connection characteristics of the adjacent solar cells 10. In this case, on one surface of each solar cell 10, the plurality of wiring members 142 may be spaced apart from each other in the second direction crossing the first direction. In particular, the plurality of wiring members 142 may be positioned to be spaced apart from each other in the second direction within the adjacent portion (e.g. the overlapping portion OP).

In the present embodiment, the wiring member 142 may be composed of a wire having a smaller width than a ribbon having a relatively wide width (e.g. greater than 1 mm) used in the past. For example, the width, diameter, or thickness (especially, width or diameter) of the wiring member 142 may be 500 μm or less (e.g. 160 μm to 300 μm, more specifically 160 μm to 210 μm). In addition, the width, diameter, or thickness of the wiring member 142 may be larger than the widths of the first and second finger lines 42a and 44a and smaller than the pitch thereof. In addition, the width, diameter, or thickness of the wiring member 142 may be larger than the first and second line portions 421 and 441 and equal to or smaller than the first and second pad portions 422 and 442. Here, the width, diameter, or thickness of the wiring member 142 may mean the largest width, diameter, or thickness among the width, diameter, or thickness of the wiring member 142. When the wiring member 142 has the width, diameter, or thickness in the above-described range, it may be smoothly attached to the solar cell 10 while keeping the resistance of the wiring member 142 low and minimizing light loss.

In addition, a larger number of wiring members 142 than the number of existing ribbons (e.g. 2 to 5) may be used based on one surface of each solar cell 10. Then, the moving distance of the carrier may be reduced by a large number of wiring members 142 while minimizing light loss and material cost by the wiring member 142 due to the small width. In this way, the efficiency of the solar cell 10 and the output of the solar cell panel 100 may be improved by reducing the moving distance of the carrier while reducing light loss, and it is possible to improve the productivity of the solar cell panel 100 by reducing the material cost due to the wiring member 142.

In the case of using a large number of wiring member 142 having such a small width, in order to prevent the process of attaching the wiring material 142 to the solar cell 10 from becoming complicated, in the present embodiment, the wiring member 142 may have a structure including a core layer 142a and a solder layer 142b formed on the surface thereof. The solder layer 142b may include a solder material and may serve as a kind of adhesive layer for soldering to the electrodes 42 and 44. For example, the core layer 142a may include Ni, Cu, Ag, Al, or the like as a main substance (e.g. a substance containing 50 wt % or more, more specifically, a substance containing 90 wt % or more). The solder layer 142b may include a solder substance such as Pb, Sn, SnIn, SnBi, SnPb, SnPbAg, SnCuAg, and SnCu as a main substance. However, the present disclosure is not limited thereto, and the core layer 142a and the solder layer 142b may include various substances.

As described above, when the wiring member 142 includes the core layer 142a and the solder layer 142b, the wiring member 142 may be fixed and attached to the electrodes 42 and 44 by a soldering process in which heat and pressure are applied while the plurality of wiring members 142 are placed on the solar cell 10. Accordingly, a large number of wiring members 142 can be effectively attached to the solar cell 10.

The wiring member 142 or the core layer 142a that occupies most of the wiring member 142 included therein may include a rounded portion. That is, the cross section of the wiring member 142 or the core layer 142a may include at least a portion of a circular shape, or a portion of a circular shape, an elliptical shape, or a portion of an elliptical shape, a curved portion, or a rounded portion.

When the wiring member has such a shape, the wiring member 142 can be formed in a structure in which the solder layer 142b is entirely located on the surface of the core layer 142a. Therefore, in the present embodiment, the wiring member 142 can be attached by omitting the process of separately applying the solder material and placing the wiring member 142 directly on the solar cell 10. Accordingly, the process of attaching the wiring member 142 can be simplified. In addition, reflection or diffuse reflection is induced in the rounded portion of the wiring member 142 so that the light reflected on the wiring member 142 may be re-incident to the solar cell 10 and reused. Accordingly, since the amount of light incident on the solar cell 10 is increased, the efficiency of the solar cell 10 and the output of the solar cell panel 100 may be improved. However, the present disclosure is not limited thereto. Accordingly, the wire constituting the wiring member 142 may have a polygonal shape such as a triangle or a square, and may have various other shapes.

In this case, the number of wiring members 142 may be 6 to 33 (e.g. 8 to 33, for example, 10 to 33, in particular, 10 to 15) based on one surface of the solar cell 10, and may be positioned at a uniform interval from each other. In each solar cell 10, the plurality of wiring members 142 may have a symmetrical shape when viewed from the extending direction of the first or second finger lines 42a and 44a. Accordingly, it is possible to minimize the moving distance of the carrier while providing a sufficient number of wiring members 142. The wiring member 142 may be positioned to correspond to the first and second bus bars 42b and 44b, respectively.

On the other hand, when the wiring member 142 is attached to the solar cell 10 by the tabbing process, as shown in FIG. 4, the shape of the solder layer 142b changes in the portion of the wiring member 142 attached or connected to the solar cell 10.

More specifically, the wiring member 142 is attached to at least the first and second pad portions 422 and 442 by the solder layer 142b. In this case, the solder layer 142b of each wiring member 142 is positioned separately from the other wiring member 142 or the solder layer 142b. When the wiring member 142 is attached to the solar cell 10 by the tabbing process, during the tabbing process, each solder layer 142b entirely flows down toward the first or second electrodes 42 and 44 (more specifically, the first and second pad portions 422 and 442) so that the width of the solder layer 142b may gradually increase toward the first and second pad portions 422 and 442 in a portion adjacent to each of the first and second pad portions 422 and 442 or between the first and second pad portions 422 and 442 and the core layer 142a. For example, in the solder layer 142b, a portion adjacent to the first and second pad portions 422 and 442 may have a width equal to or greater than the width or diameter of the core layer 142a. In this case, the width of the solder layer 142b may be equal to or smaller than the width of the first and second pad portions 422 and 442.

More specifically, the solder layer 142b has a shape protruding toward the outside of the solar cell 10 according to the shape of the core layer 142b on the top of the core layer 142a, on the other hand, the solder layer 142b includes a portion having a concave shape with respect to the outside of the solar cell 10 in the lower portion of the core layer 142a or a portion adjacent to the first and second pad portions 422 and 442. Accordingly, an inflection point at which the curvature changes is positioned on the side of the solder layer 142b. From this shape of the solder layer 142b, it can be seen that the wiring member 142 is individually attached and fixed by the solder layer 142b without being inserted or covered in a separate layer, film, or the like. According to present embodiments, by attaching the wiring member 142 by the solder layer 142b without using a separate layer or film, etc. the solar cell 10 and the wiring member 142 can be connected by a simple structure and process. In particular, since the wiring member 142 having a narrow width and rounded shape as in the present embodiment can be attached without using a separate layer or film (for example, a conductive adhesive film containing a resin and a conductive material), the process cost and time of the wiring member 142 can be minimized.

On the other hand, even after the tabbing process, the portion of the wiring member 142 positioned in a portion where no heat is applied or relatively little heat is applied (for example, the outside of the solar cell 10), as shown in the enlarged circle on the left of FIG. 1, has a shape having a uniform thickness over the entire surface of the core layer 142a.

According to the present embodiment, light loss can be minimized due to diffuse reflection or the like by using the wire-shaped wiring member 142, and it is possible to reduce the moving path of the carrier by increasing the number of wiring members 142 and reducing the pitch of the wiring members 142. In addition, by reducing the width or diameter of the wiring member 142, material cost can be greatly reduced. Accordingly, the efficiency of the solar cell 10 and the output of the solar cell panel 100 may be improved.

As described above, the solar cell 10 formed by cutting the mother solar cell 100a along a cutting line extending in one direction (e.g. the y-axis direction in the drawing) may have a long axis and a short axis. In this way, a plurality of solar cells 10 each having the long axis and the short axis may be elongated in the first direction (the x-axis direction of the drawing) by using the wiring member 142.

More specifically, in the plurality of solar cells 10, a portion of two solar cells (i.e. the first and second solar cells 10a, 10b) adjacent to each other includes an overlapping portion OP overlapping each other. That is, a portion of one side (upper side of FIG. 5) of the front surface of the first solar cell 10a in the short axis direction and a portion of the other side (lower side of FIG. 5) on the rear surface of the second solar cell 10b overlap to form an overlapping portion OP, and the overlapping portion OP may be extended along the long axis direction of the first and second solar cells 10a and 10b. In this case, the plurality of wiring members 142 may be positioned to pass through the overlapping portion OP between the front surface of the first solar cell 10a and the rear surface of the second solar cell 10b positioned thereon. Accordingly, the first and second solar cells 10a and 10b are connected. The plurality of wiring members 142 may be extended along the short axis direction, a direction crossing the first and second finger lines 42a and 44a, and a length direction of the solar cell string S. Accordingly, the first electrode 42 of the first solar cell 10a and the second electrode 44 of the second solar cell 10b are electrically connected by the plurality of wiring members 142.

In this case, the plurality of wiring members 142 are formed to be extended on the front surface of the first solar cell 10a, the adjacent portion (for example, the overlapping portion OP), and the rear surface of the second solar cell 10b. For example, the plurality of wiring members 142 may be extended in the short axis direction so as to pass through the overlapping portion OP, and may be positioned to pass through the plurality of first and second finger lines 42a and 44a extending in the long axis direction. Here, each of the plurality of wiring members 142 includes an intervening portion 1421 positioned between the front surface of the first solar cell 10a and the rear surface of the second solar cell 10b in the adjacent portion (e.g. overlapping portion OP) and a first extension portion 1422 being extended from the intervening portion 1421 to a light receiving portion other than the adjacent portion (e.g. overlapping portion OP) from the front surface of the first solar cell 1421. In addition, a second extension portion 1423 being extended from the other side of the intervening portion 1422 to a portion other than the adjacent portion (e.g. overlapping portion OP) from the rear surface of the second solar cell 10b may be further included. Accordingly, each wiring member 142 may be extended and positioned from one side (lower side of FIG. 5) of the first solar cell 10a opposite to the adjacent portion (e.g. overlapping portion OP) in the first direction to the other side (upper side of FIG. 5) of the second solar cell 10b opposite to the adjacent portion (e.g. overlapping portion OP).

In this case, as described above, the plurality of first finger lines 42a being extended in the long axis direction may be provided on the front surfaces of the first and second solar cells 10a and 10b, and the plurality of second finger lines 44a being extended in the long axis direction may be provided on the rear surfaces of the first and second solar cells 10a and 10b. Then, as shown in the lower enlarged view of FIG. 5, the first extension portion 1422 may be formed in the short axis direction or the first direction to be positioned to pass through the plurality of first finger lines 42a positioned on the front surface of the first solar cell 10a. In this case, the first extension portion 1422 may be extended parallel to the first bus bar 42b connected to the plurality of first finger lines 42a to be connected to the first bus bar 42b (i.e. the first pad portion 422 and the first line portion 421). In addition, as shown in the enlarged upper view of FIG. 5, the second extension portion 1423 may be formed in the short axis direction or the first direction to be formed to pass through the plurality of second finger lines 44a positioned on the rear surface of the second solar cell 10b. In this case, the second extension portion 1423 may be extended parallel to the second bus bar 44b connected to the plurality of second finger lines 44a to be connected to the second bus bar 44b (i.e. the first pad portion 442 and the first line portion 441). For reference, the lower enlarged view of FIG. 5 is a front plan view of the first solar cell 10a, and the upper enlarged view of FIG. 5 is a rear plan view of the second solar cell 10b.

Having the short axis and the long axis like this, the first and second finger lines 42a and 44a are formed in the long axis direction in the first and second solar cells 10a and 10b, and the first and second finger lines 42a and 44a may stably collect carriers by positioning the wiring member 142 in the short axis direction. In addition, since a large number of wiring members 142 may be provided, the carrier movement path is short, so that carrier collection efficiency can be effectively improved. In addition, by positioning the wiring member 142 in the short axis direction, since the length of the wiring member 142 connecting the first and second solar cells 10a and 10b can be reduced, it is possible to prevent problems due to thermal stress that may occur when the wiring member 142 is lengthened.

In particular, since the plurality of wiring members 142 positioned between the front surface of the first solar cell 10a and the rear surface of the second solar cell 10b may include the first extension portion 1422 being extended in the direction crossing the plurality of first finger lines 42a, it is possible to improve current collection efficiency at the front surface. When the first conductivity type region 20 serving as an emitter region is provided on the front surface, the current collection efficiency can be effectively improved. In addition, the first extension portion 1422 and the second extension portion 1423 may be provided to improve the current collection efficiency on both surfaces.

In this case, the wiring member 142 may be directly connected to at least one of the finger lines 42a and 44a and the bus bars 42b and 44b among the first and second electrodes 42 and 44. More specifically, the wiring member 142 may be connected to at least one of the plurality of first finger lines 42a and the first bus bar 42b of the first solar cell 10a, and the wiring member 142 may be connected to at least one of the plurality of second finger lines 44a and second bus bars 44b of the second solar cell 10b. Accordingly, since it is not necessary to form a separate pad electrode or the like for connection with the wiring member 142, the structure and manufacturing process can be simplified. In addition, it is possible to minimize light loss due to the separate pad electrode or the like. In addition, the wiring member 142 may serve as an interconnector connecting the first and second solar cells 10a and 10b, as well as a current collecting electrode collecting current or a bypass electrode providing a bypass path for a carrier.

In addition, since the first and second solar cells 10a and 10b are connected with the overlapping portion OP, the number of solar cells 10 positioned in the solar cell panel 100 and an area of a region in which the solar cells 10 are positioned can be maximized. Accordingly, the output of the solar cell panel 100 and efficiency per unit area may be improved. In this case, since the first and second solar cells 10a and 10b are connected using the plurality of wiring members 142 being extended in the direction crossing the length direction of the overlapping portion OP, in the conventional structure including the overlapping part OP, a conductive adhesive layer that was positioned along the length direction of the overlapping part OP is not provided. The conventionally used conductive adhesive layer may be made of an electrical conductive adhesive (ECA) or the like. In order to form such a conductive adhesive layer, a complex process, which is formed by applying a conductive adhesive material in a liquid or paste state having a viscosity including a conductive material, a binder, a solvent, etc. by a nozzle or the like and then curing at a certain temperature, has to be performed. In the present embodiment, since the process of forming the conductive adhesive layer can be omitted, the manufacturing process can be simplified, the stability of the manufacturing process can be improved, and material cost can be reduced.

In the present embodiment, the wiring member 142 may be attached and fixed to the pad portions 422 and 442, or may be attached and fixed to the line portions 421 and 441. Accordingly, the wiring member 142 in the overlapping portion OP may be attached and fixed to at least a part of the first bus bar 42b of the first solar cell 10a, or may be attached and fixed to at least a part of the second bus bar 44b of the second solar cell 10b. That is, the wiring member 142 in the overlapping part OP may be attached and fixed to the first pad portion 422 and/or the first line portion 421 of the first solar cell 10a positioned in the overlapping part OP, and may be attached and fixed to at least a part of the second pad portion 442 and/or the second line portion 441 of the second solar cell 10b positioned in the overlapping portion OP. Accordingly, adhesion of the wiring member 142 within the overlapping portion OP may be stably implemented.

For example, as shown in FIG. 6(a), the first pad portion 422 of the first solar cell 10a and the second pad portion 442 of the second solar cell 10b are positioned in the overlapping portion OP, respectively, so that the wiring member 142 (i.e. the intervening portion 1421) may be attached and fixed (for example, directly connected) to the first pad portion 422 of the first solar cell 10a and the second pad portion 442 of the second solar cell 10b in the overlapping portion OP, respectively. Alternatively, as shown in FIG. 6(b), the first line portion 421 of the first solar cell 10a and the second line portion 441 of the second solar cell 10b are positioned in the overlapping portion OP, respectively, so that the wiring member 142 (i.e. the intervening portion 1421) may be attached and fixed (for example, directly connected) to the first line portion 421 of the first solar cell 10a and the second line portion 441 of the second solar cell 10b in the overlapping portion OP, respectively. FIGS. 6(a) and 6(b) illustrate that the wiring member 142 is attached and fixed to the pad portions 422 and 442, respectively, or attached and fixed to the line portions 421 and 441, respectively, in the overlapping portion OP. However, the present disclosure is not limited thereto, and the wiring member 142 (i.e. the intervening portion 1421) may be attached and fixed (for example, directly connected) to at least one of the first pad portion 422 and the first line portion 421 of the first solar cell 10a, and may be attached and fixed (for example, directly connected) to at least one of the second pad portion 442 and the second line portion 441 of the second solar cell 10b in the overlapping portion OP, respectively.

And as shown in FIG. 6(c), the first bus bar 42b or the first electrode 42 of the first solar cell 10a is positioned in the overlapping portion OP, but the second bus bar 44b or the second electrode 44 of the second solar cell 10b is not positioned, so that the wiring member 142 (i.e. the intervening portion 1421) may be attached and fixed (for example, directly connected) to the first bus bar 42b or the first electrode 42 of the first solar cell 10a, and may not be attached or fixed to the second bus bar 44b or the second electrode 44 of the second solar cell 10b in the overlapping portion OP. Alternatively, as shown in FIG. 6(d), the second bus bar 44b or the second electrode 44 of the second solar cell 10b is positioned in the overlapping portion OP, but the first bus bar 42b or the first electrode 42 of the first solar cell 10a is not positioned, so that the wiring member 142 (i.e. the intervening portion 1421) may be attached and fixed (for example, directly connected) to the second bus bar 44b or the second electrode 44 of the second solar cell 10b, and may not be attached or fixed to the first bus bar 42b or the first electrode 42 of the first solar cell 10a in the overlapping portion OP.

However, the present disclosure is not limited thereto. In addition, as in the embodiment to be described later with reference to FIG. 10, when the first and/or second bus bars 42b, 44b are not provided, the wiring member 142 may be electrically and/or physically connected (for example, directly connected) to the finger lines 42a and 44a of the first and/or second electrodes 42 and 44 in the overlapping portion OP. And even if the electrodes 42 and 44 are positioned within the overlapping portion OP, the wiring member 142 may be positioned in a state where it is not attached and fixed between the first electrode 42 of the first solar cell 10a and the second electrode 44 of the second solar cell 10b within the overlapping portion OP. In addition, the first electrode 42 of the first solar cell 10a and the second electrode 44 of the second solar cell 10b are not positioned within the overlapping portion OP, so that the wiring member 142 may not be directly electrically and/or physically connected to the first and/or second electrodes 42 and 44 within the overlapping portion OP. In addition, when there is no adjacent portion as in the embodiment shown in FIG. 12, the intervening portion 1421 of the wiring member 142 may be positioned between the first and second solar cells 10a and 10b at portions where the first and second solar cells 10a and 10b are adjacent to each other. Other variations are possible.

In this case, since the wiring member 142 is positioned between the first and second solar cells 10a and 10b so that it passes through the overlapping portion OP, the connection structure of the first and second solar cells 10a and 10b may be firmly maintained. Here, since the width, diameter, or thickness of the wiring member 142 is small, the stability of the connection structure between the first and second solar cells 10a and 10b may be further improved. On the other hand, if the width, diameter, or thickness of the wiring member 142 passing through the overlapping portion OP is large, since pressure is applied to the solar cell 10 by the wiring member 142 positioned in the overlapping portion OP, problems such as damage or cracking of the solar cell 10 may occur.

In the present embodiment, at least a part of the rear surface of the second solar cell 10b positioned on the first solar cell 10a is positioned in front of the front surface of the first solar cell 10a. Here, the term "positioning in the front" may mean that it is positioned in the front side when viewed from the thickness direction (z-axis direction in the drawing) of the solar cell panel 100, and may mean that it is positioned in the front side when viewed from the thickness direction (that is, a direction orthogonal to the first and second solar cells 10a and 10b, and a direction that is inclined to all the x-axis, y-axis, and z-axis of the drawing) of the first and second solar cells 10a and 10b. For example, the rear surface of the second solar cell 10b may be positioned in front of the front surface of the first solar cell 10a in a portion where the first and second solar cells 10a, 10b are adjacent to each other (for example, an adjacent portion such as an overlapping portion OP). In this case, when viewed from the thickness direction of the first and second solar cells 10a and 10b, the rear surface of the second solar cell 10b may be positioned in front of the front surface of the first solar cell 10a by the width, diameter, or thickness of the wiring member 142 at least in the overlapping portion OP or the adjacent portion of the first and second solar cells 10a and 10b. As an example, when viewed from the thickness direction of the first and second solar cells 10a and 10b, the rear surface of the second solar cell 10b may be positioned in front of the front surface of the first solar cell 10a as a whole.

Here, in the thickness direction of the first or second solar cells 10a and 10b, the positional difference of the wiring member 142 may be smaller than the thickness of the first or second solar cells 10a and 10b. That is, in the thickness direction of the first or second solar cells 10a and 10b, the positional difference between the intervening portion 1421 and the first extension portion 1422, between the intervening portion 1421 and the second extension portion 1423, and between the first extension portion 1422 and the second extension portion 1423 may be smaller than the thickness of the first or second solar cells 10a, 10b. For example, in the thickness direction of the first or second solar cells 10a and 10b, the positional difference between the intervening portion 1421 and the first extension portion 1422, between the intervening portion 1421 and the second extension portion 1423, and between the first extension portion 1422 and the second extension portion 1423 may be 50% or less (for example, 30% or less) of the thickness of the first or second solar cells 10a, 10b.

Alternatively, when viewed in a cross section (xz plane in the drawing) perpendicular to the second direction (y-axis direction in the drawing), the wiring member 142 extending from one side (left side of FIG. 2) of the first solar cell 10a to the other side (right side of FIG. 2) of the second solar cell 10b does not have a bent or folded portion to have an acute angle. For example, the first and second solar cells 10a and 10b may be positioned substantially parallel to each other, and the wiring member 142 positioned between the first and second solar cells 10a and 10b may be positioned substantially parallel to the first and second solar cells 10a and 10b. Accordingly, the wiring member 142 may have a small angle of 150 to 180 degrees (for example, 160 to 180 degrees) among the angles at the curved portion, even if the wiring member 142 is slightly curved. In this way, since the wiring member 142 does not have a bent, folded, or largely bent portion, even if the width, diameter, or thickness of the wiring member 142 is small, problems such as damage or deterioration of characteristics of the wiring member 142 do not occur.

Conventionally, in a state in which the front surfaces of the first and second solar cells are substantially positioned on the same plane, and the rear surfaces of the first and second solar cells are substantially positioned on the same plane, the wiring member should be extended from the front surface of the first solar cell to the rear surface of the second solar cell. Accordingly, since the wiring member should be extended from the front surface positioned on completely different planes to the rear surface, the wiring member has a largely bent portion (e.g. a portion bent at an angle of less than 150 degrees) or the like. Accordingly, when the width, diameter, or thickness of the wiring member is small, damage, deterioration of characteristics of the wiring member, and the like may cause problems. In addition, since the wiring member should be extended from the front surface to the rear surface between the side surface of the first solar cell and the side surface of the second solar cell, a distance (distance between the side surfaces) between the first solar cell and the second solar cell must be sufficiently secured. If the distance between the first solar cell and the second solar cell is not sufficient, unwanted shunt may occur due to the wiring member. Accordingly, there is a limit to reducing the distance between the plurality of solar cells, so the number of solar cells included in the solar cell panel was small, and the area of the region where the solar cells are not positioned was large. Accordingly, there was a limit to improving the output of the solar cell panel and the efficiency per unit area.

For example, in the present embodiment, the width, diameter, or thickness (in particular, width or diameter) of the wiring member 142 may be smaller than the width of the overlapping portion OP in the short axis direction of the solar cell 10. In addition, the distance between the first solar cell 10a and the second solar cell 10b positioned at the overlapping portion OP in the thickness direction may be smaller than the width of the overlapping portion OP in the short axis direction of the solar cell 10. Then, the structural stability of the connection structure between the first and second solar cells 10a and 10b may be excellent. In particular, in the present embodiment, since the solar cell 10 having a long axis and a short axis is used, the width, diameter, or thickness of the wiring member 142 may be further reduced. If the mother solar cell 100a is used as it is, due to the high resistance, the width of the wiring member 142 must be secured beyond a certain level, however, if the solar cell 10 cut to have a short axis and a long axis as in the present embodiment is used, since the resistance is small due to a small area, the width, diameter, or thickness (in particular, width or diameter) of the wiring member 142 may be further reduced. For example, the width, diameter, or thickness (in particular, width or diameter) of the wiring member 142 may be 210 µm or less (e.g. 160 µm to 210 µm). Accordingly, it is possible to further improve structural stability by further reducing the width, diameter, or thickness (in particular, width or diameter) of the wiring member 142.

A process of connecting the first and second solar cells 10a and 10b according to the above-described embodiment is as follows. A plurality of first wiring members 142 are disposed on a worktable, and the first solar cell 10a is positioned so that the second finger line 44a of the second electrode 44 of the first solar cell 10a is intersected with and connects to the first wiring member 142 thereon. Further, a plurality of second wiring members 142 are positioned on the first solar cell 10a so as to intersect with the first finger line 42a of the first electrode 42 of the first solar cell 10a, and the second solar cell 10b is positioned on the first solar cell 10a and the second wiring member 142 so as to form the overlapping portion OP with the first solar cell 10a. In this case, the plurality of second wiring members 142 and the second finger lines 44a of the second electrodes 44 of the second solar cell 10b may be intersected and connected. If a soldering process that applies heat and pressure while repeating this process is performed, the wiring member 142 may be fixed and attached to the first electrode 42 of one solar cell (for example, the first solar cell 10a) and the second electrode 44 of a solar cell (for example, the second solar cell 10b) adjacent thereto. The connection structure of the adjacent first and second solar cells 10a and 10b as described above may constitute the solar cell string S consisting of a row by being continuously repeated in two adjacent solar cells 10 and connecting the plurality of solar cells 10 in series along the first direction (x-axis direction of the drawing) or the short axis direction of the solar cell 10. Accordingly, the solar cell string S may be formed by allowing the adjacent solar cells 10 to have adjacent portions by adjusting the distance between the adjacent solar cells 10 in the tabbing device to zero (0) or negative (−). Accordingly, the existing tabbing device can be used by changing the setting, thereby reducing the burden of equipment. The solar cell string S may be formed by various methods or devices.

In the above-described embodiment, it is illustrated that two solar cells 10 are manufactured by cutting one mother solar cell 100a with one cutting line CL, and the solar cell panel 100 is formed by connecting the solar cells 10. Unlike this, as shown in FIG. 7, three or more solar cells 10 may be manufactured from one mother solar cell 100a by cutting one mother solar cell 100a with two or more cutting lines CL. In this case, the plurality of cutting lines CL may have a shape being extended in parallel to each other, and may be formed to be spaced apart at regular intervals in a direction intersecting with the length direction. FIG. 7 illustrates that three solar cells 10 are manufactured from one mother solar cell 100a with two cutting lines CL, but four or more solar cells 10 may be manufactured from one mother solar cell 100a by having three or more cutting lines CL.

Here, in each solar cell 10 having a short axis and a long axis, a length ratio of the long axis to the short axis may be 1.5 to 4.5 (for example, 1.5 to 3.5). This range corresponds to the case of considering the overlapping portion OP and the process error in the case of manufacturing 2 to 4 solar cells 10 along 1 or 3 (for example, 1 or 2) cutting lines CL from the mother solar cell 100a. A plurality of solar cells 10 may be manufactured and used from the mother solar cell 100a to achieve the above-described effects. In this case, when the number of the plurality of solar cells 10 manufactured from the mother solar cell 100a is 4 or less (for example, 3 or less), it is possible to minimize a dead area due to the overlapping portion OP. However, the present disclosure is not limited thereto.

In addition, in the above-described embodiment, it is illustrated that a plurality of solar cells 10 are arranged and connected to maintain the shape of the mother solar cell 100a as it is. That is, an inclined portion 12b is disposed according to the shape of the mother solar cell 100a, so that long sides in which the inclined portion 12b is positioned may form the overlapping portion OP, long sides in which the inclined portion 12b is not positioned may form the overlapping portion OP. Accordingly, the two solar cells 10 constituting the overlapping portion OP may have a symmetrical shape with each other, and thus electrical and structural connection characteristics may be improved. However, the present disclosure is not limited thereto. Accordingly, as a modified example, as shown in FIG. 8, the long side in which the inclined portion 12b is positioned and the long side in which the inclined portion 12b is not positioned may be arranged to form the overlapping portion OP. Other variations are possible. For the sake of simplicity, FIG. 8 mainly shows the inclined portion 12b, and the wiring member 142 is not shown.

According to the present embodiment, the number of solar cells 10 included in the solar cell panel 100 and the area where the solar cells 10 are positioned may be maximized by applying a structure that minimizes the distance between the solar cells 10. Accordingly, the output of the solar cell panel 100 may be improved and efficiency per unit area may be improved. In this case, since the conductive adhesive layer is not used, the manufacturing process may be simplified, the stability of the manufacturing process may be improved, and the cost may be reduced. In particular, by applying the overlapping portion OP and the wiring member 142, the connection structure of the solar cell 10 may be firmly maintained, and the collection efficiency of the carrier may be maximized. In this case, even when the solar cell 10 has a long axis and a short axis and thus the wiring member 142 having a small width, diameter, or thickness (in particular, width or diameter) is provided, structural and electrical connection stability may be improved.

Hereinafter, a solar cell according to another embodiment of the present disclosure and a solar cell panel including the same will be described in detail. Detailed descriptions of parts that are the same or extremely similar to those of the above description will be omitted, and only different parts will be described in detail. In addition, combinations of the above-described embodiments or modified examples thereof and the following embodiments or modified examples thereof are also within the scope of the present disclosure.

FIG. 9 is a plan view illustrating two solar cells formed by cutting one mother solar cell according to another embodiment of the present disclosure. For clearer understanding, the enlarged view of FIG. 9 schematically illustrates a wiring member to be attached to a first solar cell by a dashed-dotted line.

Referring to FIG. 9, in the present embodiment, the bus bars 42b and 44b of the first and/or second electrodes 42 and 44 may not include a pad portion (reference numerals 422 and 442 in FIG. 3, the same hereinafter), but may include line portions 421 and 441. Accordingly, as shown in the enlarged circle of FIG. 9, the wiring member 142 is attached thereto on the line portions 421 and 441 or placed on the line portions 421 and 441 so that it may be electrically and/or physically connected to the first and/or second electrodes 42, 44. Since the pad portions 422 and 442 are not provided, the material cost of the electrodes 42 and 44 can be reduced, and loss of light incident into the solar cell 10 can be minimized. In the present embodiment, the wiring member 142 is positioned in the short axis direction, and the wiring member 142 is positioned between the first and second solar cells 10a and 10b by the overlapping portion OP, so that it may be stably fixed to the first and second solar cells 10a and 10b. Accordingly, electrical and/or physical connection of the wiring member 142 can be stably implemented even if the pad portions 422 and 442 are not provided.

FIG. 10 is a plan view illustrating two solar cells formed by cutting one mother solar cell according to still another embodiment of the present disclosure. For clearer understanding, the enlarged view of FIG. 10 schematically illustrates a wiring member to be attached to a first solar cell by a dashed-dotted line.

Referring to FIG. 10, in the present embodiment, the first and/or second electrodes 42 and 44 may not include a bus bar (reference numerals 42b and 44b in FIG. 3 or 9) and may include finger lines 42a and 44a. In the drawings attached to the present disclosure, it is illustrated that an edge line L connecting ends of the finger lines 42a and 44a is provided, but it is also possible not to separately provide the edge line L. According to this, as shown in the enlarged circle of FIG.

10, the wiring member 142 is attached thereto on the finger lines 42a and 44a or placed on the finger lines 42a and 44a so that it may be electrically and/or physically connected to the first and/or second electrodes 42, 44. In the present embodiment, the wiring member 142 may directly serve as an interconnector for connecting the first and second solar cells 10a and 10b, as well as a current collecting electrode for collecting current or a bypass electrode for providing a bypass path for a carrier, etc.

Since the bus bars 42b and 44b are not provided as described above, the material cost of the electrodes 42 and 44 can be reduced, and loss of light incident into the solar cell 10 can be minimized. In the present embodiment, the wiring member 142 is positioned in the short axis direction, and the wiring member 142 is positioned between the first and second solar cells 10a and 10b by the overlapping portion OP, so that it may be stably fixed to the first and second solar cells 10a and 10b. Accordingly, electrical and/or physical connection of the wiring member 142 can be stably implemented even if the bus bars 42b and 44b are not provided.

FIG. 11 is a partial cross-sectional view schematically illustrating a plurality of solar cells and wiring members included in a solar cell panel according to still another embodiment of the present disclosure.

Referring to FIG. 11, accordingly, the first and second solar cells 10a and 10b in a first direction are in contact with each other to form an adjacent portion, and in this adjacent portion, an intervening portion (reference numeral 1421 in FIG. 4) of the wiring member 142 is positioned between the front surface of the first solar cell 10a and the rear surface of the second solar cells 10a and 10b. FIG. 11 illustrates that when viewed in cross section, the side surfaces of the first solar cells 10a adjacent to each other in the first direction coincide with the side surfaces of the second solar cells 10b adjacent thereto, but the present disclosure is not limited thereto. Accordingly, when viewed in plan view, it may be included a case where the edges of the first solar cells 10a adjacent to each other and the edges of the second solar cells 10b adjacent to each other are in contact with each other so that the distance between them becomes substantially zero.

According to this, the first and second solar cells 10a and 10b do not have an overlapping portion (reference numeral OP in FIG. 2, hereinafter the same), but since the first and second solar cells 10a and 10b are not spaced apart from each other in the first direction, the distance between the first and second solar cells 10a and 10b may be substantially zero. Accordingly, while maximizing the number of solar cells 10 included in the solar cell panel 100 and maximizing the area occupied by the solar cells 10, the area of the dead area due to the overlapping portion OP can be minimized.

In the above-described embodiments, the description related to the overlapping portion OP may be applied as it is to the adjacent portion of the present embodiment, except for the description related to the overlapping portion OP having a predetermined width.

In the above-described embodiment, it is illustrated that adjacent solar cells 10 have the overlapping portion OP or are positioned so that their sides coincide with each other, so that there is no gap between the adjacent solar cells 10. However, the present disclosure is not limited thereto. As a modified example, as shown in FIG. 12, adjacent first and second solar cells 10a and 10b are positioned with a distance between each other, but at least a portion of the second solar cell 10b positioned on the first solar cell 10a may be positioned in front of the first solar cell 10a. In this case, since the distance between the first and second solar cells 10a and 10b is very small, the position relationship between the first and second solar cells 10a and 10b described above may be maintained, and the position relationship between the first and second solar cells 10a and 10b described above may be maintained by using a separate structure or the like. Even in this case, since a wiring member or the like is not positioned between the side surfaces of the first and second solar cells 10a and 10b, the distance between the first and second solar cells 10a and 10b can be minimized.

FIG. 13 is a perspective view schematically illustrating a solar cell panel according to still another embodiment of the present disclosure.

Referring to FIG. 13, in the present embodiment, the mother solar cell itself can be used as it is without cutting the mother solar cell, and/or the wiring member 1420 connecting the adjacent solar cells 10 may have a relatively wide width (for example, more than 1 mm) or may have a rectangular cross section whose width is greater than the thickness. For example, the wiring member 1420 may be formed of a ribbon. Accordingly, the cutting process is not provided by using the mother solar cell as it is, and the manufacturing process can be simplified by using the ribbon. As described above, the structure of the solar cell 10 and the structure of the wiring member 1420 may be variously modified. In addition, in the present disclosure, wires of various structures, connection members, interconnectors, etc. may be used as the wiring members 142 and 1420.

In the present embodiment, the adjacent solar cells 10 may have an overlapping portion OP or may be disposed so that the sides thereof coincide, and the wiring member 1420 may be positioned between the adjacent solar cells 10 in the thickness direction in the overlapping portion OP or adjacent portion of the adjacent solar cell 10. The position relationship, connection relationship, etc. between the adjacent solar cell 10 and the wiring member 1420 may be described in the embodiments with reference to FIGS. 1 to 12 as it is.

As a modified example, the wiring member 142 having a small width, diameter, or thickness may be used while using the solar cell 10 as it is, the mother solar cell itself. As another modification, the wiring member 1420 having a relatively wide width (e.g. greater than 1 mm) or a square cross section having a width greater than the thickness may be used in the solar cell 10 having the long axis and the short axis cut from the mother solar cell. Other variations are possible.

The features, structures, effects and the like according to the above-described embodiments are included in at least one embodiment of the present disclosure, and are not necessarily limited to only one embodiment. Furthermore, the features, structures, effects, and the like illustrated in the embodiments may be combined or modified in other embodiments by those skilled in the art to which the embodiments belong. Accordingly, contents related to these combinations and modifications should be construed as being included in the scope of the present disclosure.

The invention claimed is:

1. A solar cell panel, comprising:
a plurality of solar cells including first and second solar cells connected to each other in a first direction, each including a semiconductor substrate, a first electrode positioned on a front surface of the semiconductor substrate, and a second electrode positioned on a rear surface of the semiconductor substrate; and
a plurality of wiring members electrically connecting the first electrode of the first solar cell and the second electrode of the second solar cell, wherein a portion of the rear surface of the second solar cell is positioned on the front surface of the first solar cell to form an overlapping portion, wherein the plurality of wiring members are formed to be extended to the front surface of the first solar cell, the overlapping portion, and the rear surface of the second solar cell, and wherein the first electrode of the first solar cell is positioned in the overlapping portion but the second electrode of the second solar cell is not positioned in the overlapping portion, or the second electrode of the second solar cell is positioned in the overlapping portion but the first electrode of the first solar cell is not positioned in the overlapping portion.

2. The solar cell panel of claim 1, wherein the first electrode includes a plurality of first finger lines formed in a second direction crossing the first direction, and each of the plurality of wiring members is extended in the first direction.

3. The solar cell panel of claim 1, wherein the wiring member has a width or a diameter of 500 μm or less and is positioned to be spaced apart from each other in a second direction crossing the first direction.

4. The solar cell panel of claim 1, wherein at least one of the first and second electrodes include a plurality of finger lines formed in a second direction crossing the first direction, and a width or a diameter of the wiring member is smaller than a pitch of the plurality of finger lines.

5. The solar cell panel of claim 1, wherein the wiring member includes a core layer and a solder layer formed on the core layer, and is fixed and attached to the first and second electrodes by soldering using the solder layer.

6. The solar cell panel of claim 1, wherein the first and second solar cells each have a long axis and a short axis, and the plurality of wiring members are extended in a short axis direction parallel to the first direction.

7. The solar cell panel of claim 1, wherein the first and second solar cells each have a long axis and a short axis, the first electrode includes a plurality of first finger lines to be extended in the long axis direction, and each of the plurality of wiring members is extended in the short axis direction and is positioned to pass through the plurality of first finger lines of the first solar cell.

8. The solar cell panel of claim 7, wherein the second electrode includes a plurality of second finger lines to be extended in the long axis direction, and each of the plurality of wiring members is extended in the short axis direction and is positioned to pass through the plurality of second finger lines of the second solar cell.

9. The solar cell panel of claim 1, wherein at least one of the first and second electrodes includes a plurality of finger lines formed in a second direction crossing the first direction, and the plurality of wiring members are spaced apart from each other in the second direction parallel to the plurality of finger lines in the overlapping portion.

10. The solar cell panel of claim 1, wherein the second electrode includes a plurality of second finger lines to be extended in a second direction crossing the first direction, and each of the plurality of wiring members is extended in the first direction and is positioned to pass through the plurality of second finger lines of the second solar cell.

11. The solar cell panel of claim 1, wherein each of the plurality of wiring members is extended from one side of the front surface of the first solar cell opposite to the overlapping portion to the other side of the rear surface of the second solar cell opposite to the overlapping portion.

12. The solar cell panel of claim 11, wherein each of the plurality of wiring members does not have a portion bent or folded to have an acute angle from the one side of the front surface of the first solar cell to the other side of the rear surface of the second solar cell, and a difference in position of the wiring member in a thickness direction of the first or second solar cell is smaller than a thickness of the first or second solar cell.

13. The solar cell panel of claim 1, wherein the first and second solar cells each have a long axis and a short axis, the overlapping portion is extended in the long axis direction, and the wiring member is extended in the short axis direction.

14. The solar cell panel of claim 13, wherein a width, a diameter, or a thickness of the wiring member is smaller than a width of the overlapping portion in the short axis direction.

15. The solar cell panel of claim 13, wherein a distance between the first solar cell and the second solar cell positioned in the overlapping portion in the thickness direction is smaller than the width of the overlapping portion in the short axis direction.

16. The solar cell panel of claim 13, wherein the wiring member has a width or a diameter of 210 μm or less.

17. The solar cell panel of claim 1, wherein the first and second solar cells each have a long axis and a short axis, and a length ratio of the long axis to the short axis is 1.5 to 4.5 in the first and second solar cells.

18. The solar cell panel of claim 1, wherein the first electrode comprises a plurality of first bus bars extending in the first direction and a plurality of first finger lines extending in a second direction crossing the first direction, and each first bus bar comprises a plurality of first pad portions and a first line portion, wherein the second electrode comprises a plurality of second bus bars extending in the first direction and a plurality of second finger lines extending in the second direction, and each second bus bar comprises a plurality of second pad portions and a second line portion, and wherein some of the first pad portions of the first solar cell are positioned in the overlapping portion but none of the second pad portions of the second solar cell is positioned in the overlapping portion, or some of the second pad portions of the second solar cell are positioned in the overlapping portion, but none of the first pad portions of the first solar cell is positioned in the overlapping portion.

19. The solar cell panel of claim 1, wherein each wiring member comprises an intervening portion, a first extension portion, and a second extension portion, the intervening portion is positioned between the front surface of the first solar cell and the rear surface of the second solar cell in the overlapping portion, the first extension portion extends from the intervening portion to a light receiving portion other than the overlapping portion of the front surface of the first solar cell, and the second extension portion extends from the intervening portion to a portion other than the overlapping portion of the rear surface of the second solar cell, and wherein the intervening portion is attached to the first electrode of the first solar cell in the overlapping portion but is not attached to the second electrode of the second solar cell in the overlapping portion, or the intervening portion is attached to the second electrode of the second solar cell in the overlapping portion but is not attached to the first electrode of the first solar cell in the overlapping portion.

20. The solar cell panel of claim 1, wherein the first electrode comprises a plurality of first finger lines extending in a second direction crossing the first direction and comprises no bus bar, wherein the second electrode comprises a plurality of second finger lines extending in the second direction and comprises no bus bar, wherein the plurality of wiring members are physically connected to the plurality of first finger lines of the first solar cell and the plurality of second finger lines of the second solar cell, and wherein some of the plurality of first finger lines of the first solar cell are positioned in the overlapping portion but none of the plurality of second finger lines of the second solar cell is positioned in the overlapping portion, or some of the plurality of second finger lines of the second solar cell are positioned in the overlapping portion, but none of the plurality of first finger lines of the first solar cell is positioned in the overlapping portion.

* * * * *